United States Patent
Takano et al.

(10) Patent No.: US 7,851,279 B2
(45) Date of Patent: Dec. 14, 2010

(54) MANUFACTURING METHOD OF SEMICONDUCTOR DEVICE

(75) Inventors: Tamae Takano, Isehara (JP); Tetsuya Kakehata, Isehara (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 238 days.

(21) Appl. No.: 12/213,727

(22) Filed: Jun. 24, 2008

(65) Prior Publication Data

US 2009/0001452 A1    Jan. 1, 2009

(30) Foreign Application Priority Data

Jun. 29, 2007    (JP) .............................. 2007-173103

(51) Int. Cl.
H01L 21/00    (2006.01)
(52) U.S. Cl. ................... 438/155; 257/326; 257/E21.7; 257/E27.112; 438/142; 438/151
(58) Field of Classification Search ................. 257/326, 257/E21.7, E27.112; 438/142, 151, 155
See application file for complete search history.

(56) References Cited

U.S. PATENT DOCUMENTS

| | | | |
|---|---|---|---|
| 5,060,034 A | 10/1991 | Shimizu et al. | |
| 6,472,684 B1 | 10/2002 | Yamazaki et al. | |
| 6,498,369 B1 | 12/2002 | Yamazaki et al. | |
| 6,509,602 B2 | 1/2003 | Yamazaki et al. | |
| 6,759,282 B2 | 7/2004 | Campbell et al. | |
| 2002/0113268 A1 | 8/2002 | Koyama et al. | |
| 2002/0185684 A1 | 12/2002 | Campbell et al. | |
| 2003/0107077 A1 | 6/2003 | Yamazaki et al. | |
| 2005/0029592 A1 | 2/2005 | Campbell et al. | |
| 2005/0214988 A1 | 9/2005 | Campbell et al. | |
| 2007/0128784 A1 | 6/2007 | Campbell et al. | |

FOREIGN PATENT DOCUMENTS

| | | |
|---|---|---|
| EP | 0 367 152 | 5/1990 |
| JP | 04-215473 | 8/1992 |
| JP | 05-145073 | 6/1993 |
| JP | 2000-356788 | 12/2000 |
| WO | WO 02/101825 | 12/2002 |

OTHER PUBLICATIONS

International Search Report (Application No. PCT/JP2008/061077) dated Sep. 30, 2008.
Written Opinion (Application No. PCT/JP2008/061077) dated Sep. 30, 2008.

*Primary Examiner*—Thanh V Pham
*Assistant Examiner*—Marvin Payen
(74) *Attorney, Agent, or Firm*—Eric J. Robinson; Robinson Intellectual Property Law Office, P.C.

(57) ABSTRACT

The invention provides a semiconductor device and its manufacturing method in which a memory transistor and a plurality of thin film transistors that have gate insulating films with different thicknesses are fabricated over a substrate. The invention is characterized by the structural difference between the memory transistor and the plurality of thin film transistors. Specifically, the memory transistor and some of the plurality of thin film transistors are provided to have a bottom gate structure while the other thin film transistors are provided to have a top gate structure, which enables the reduction of characteristic defects of the transistor and simplification of its manufacturing process.

8 Claims, 15 Drawing Sheets

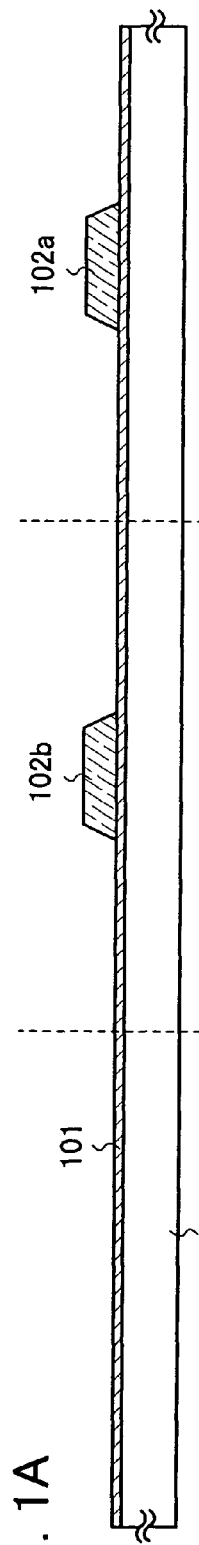
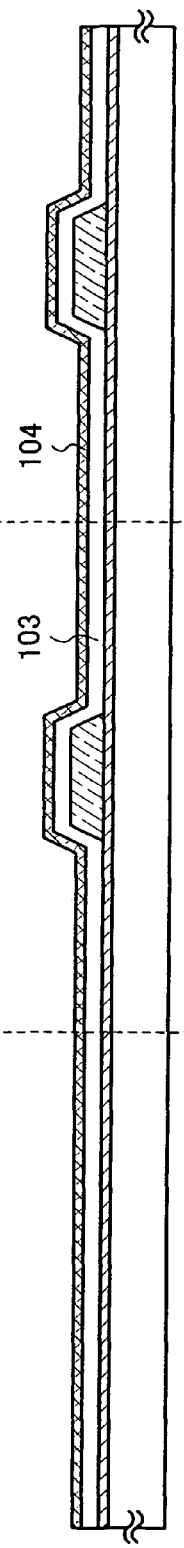
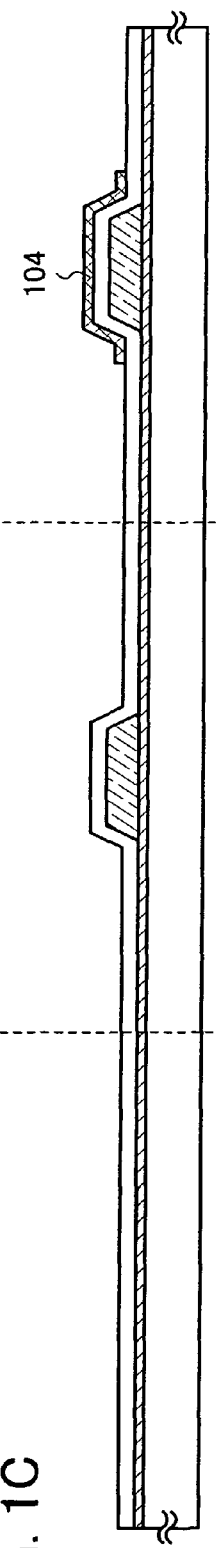
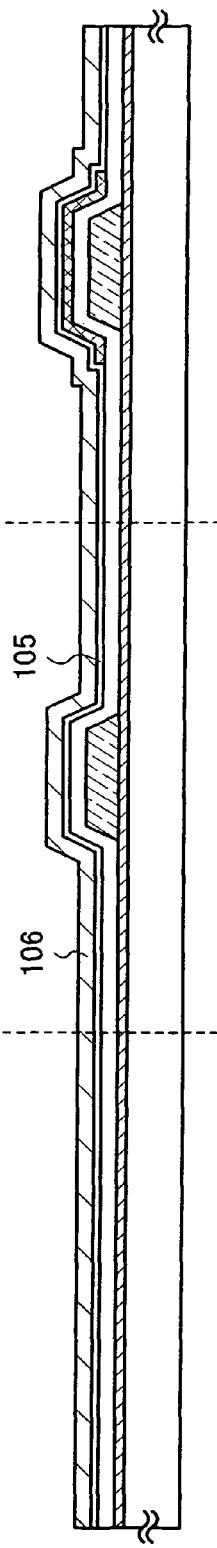
FIG. 1A
FIG. 1B
FIG. 1C
FIG. 1D

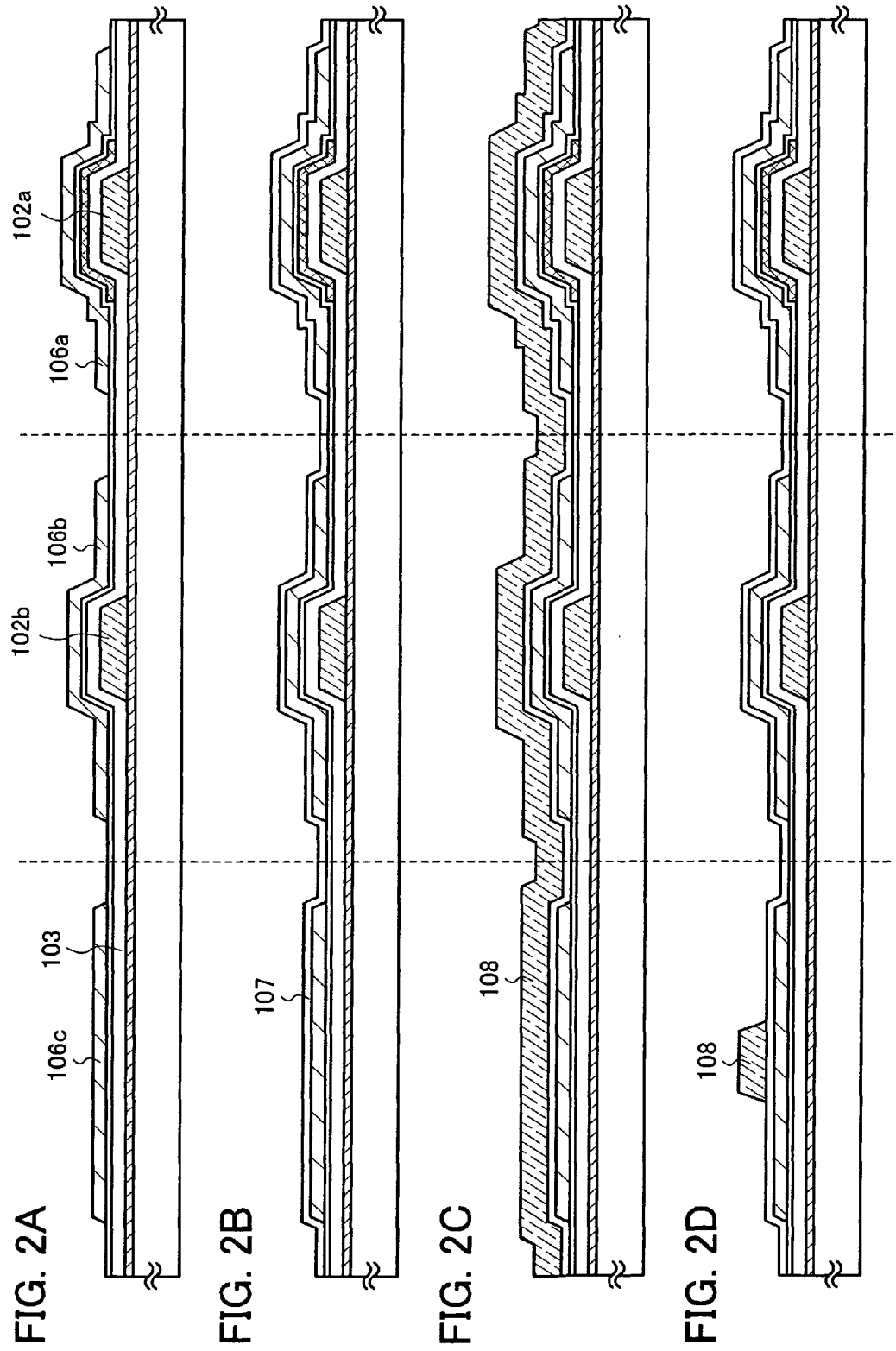

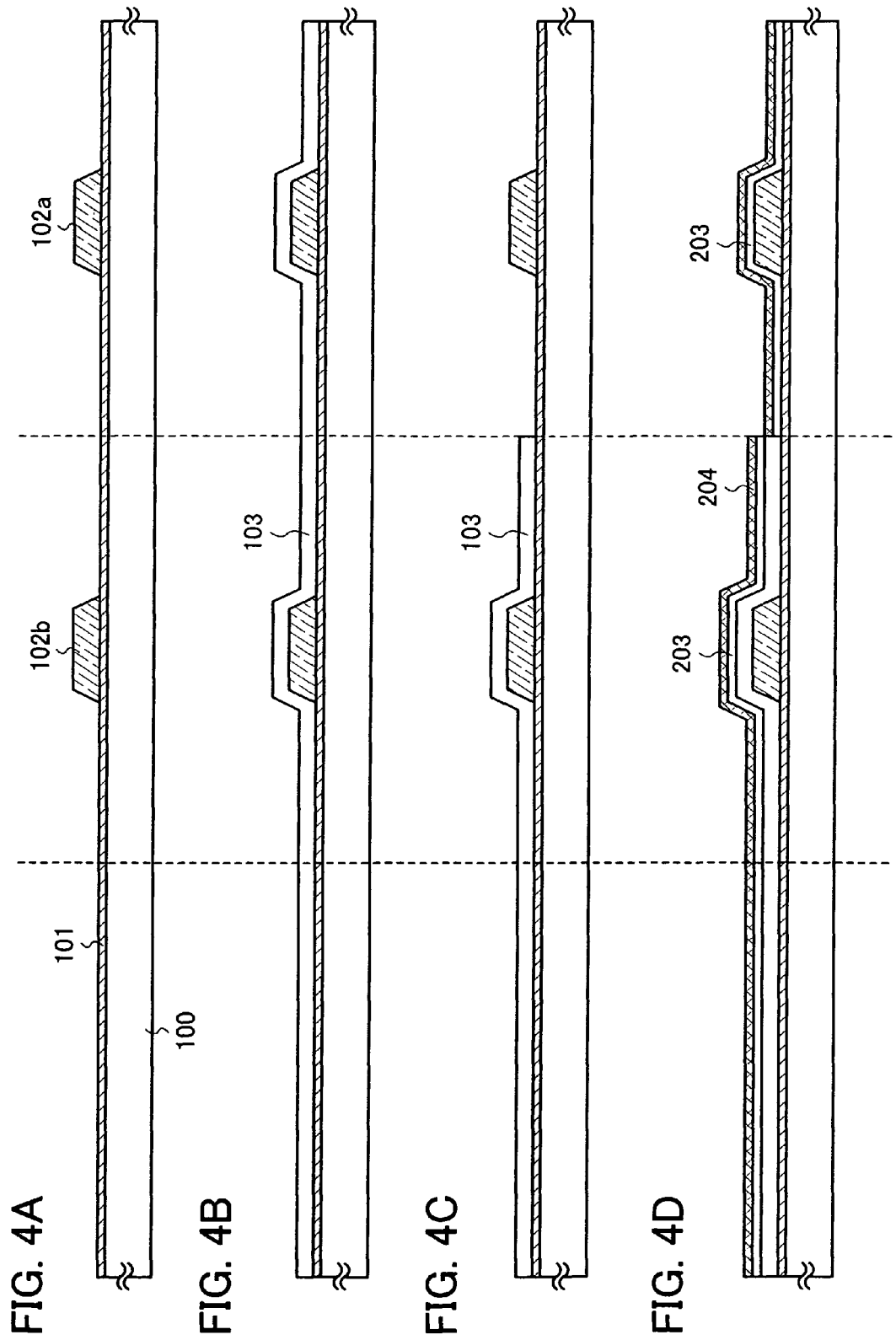

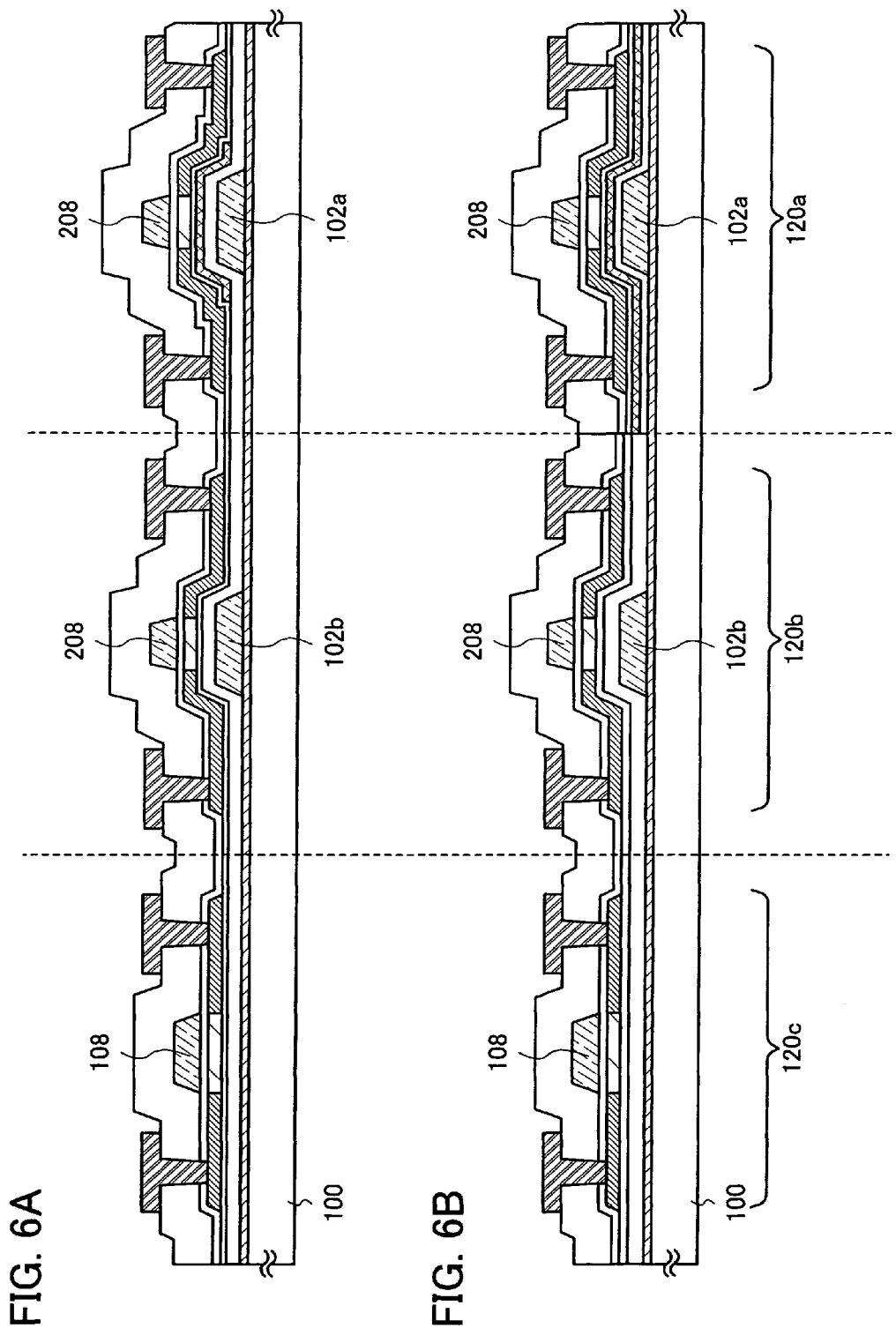

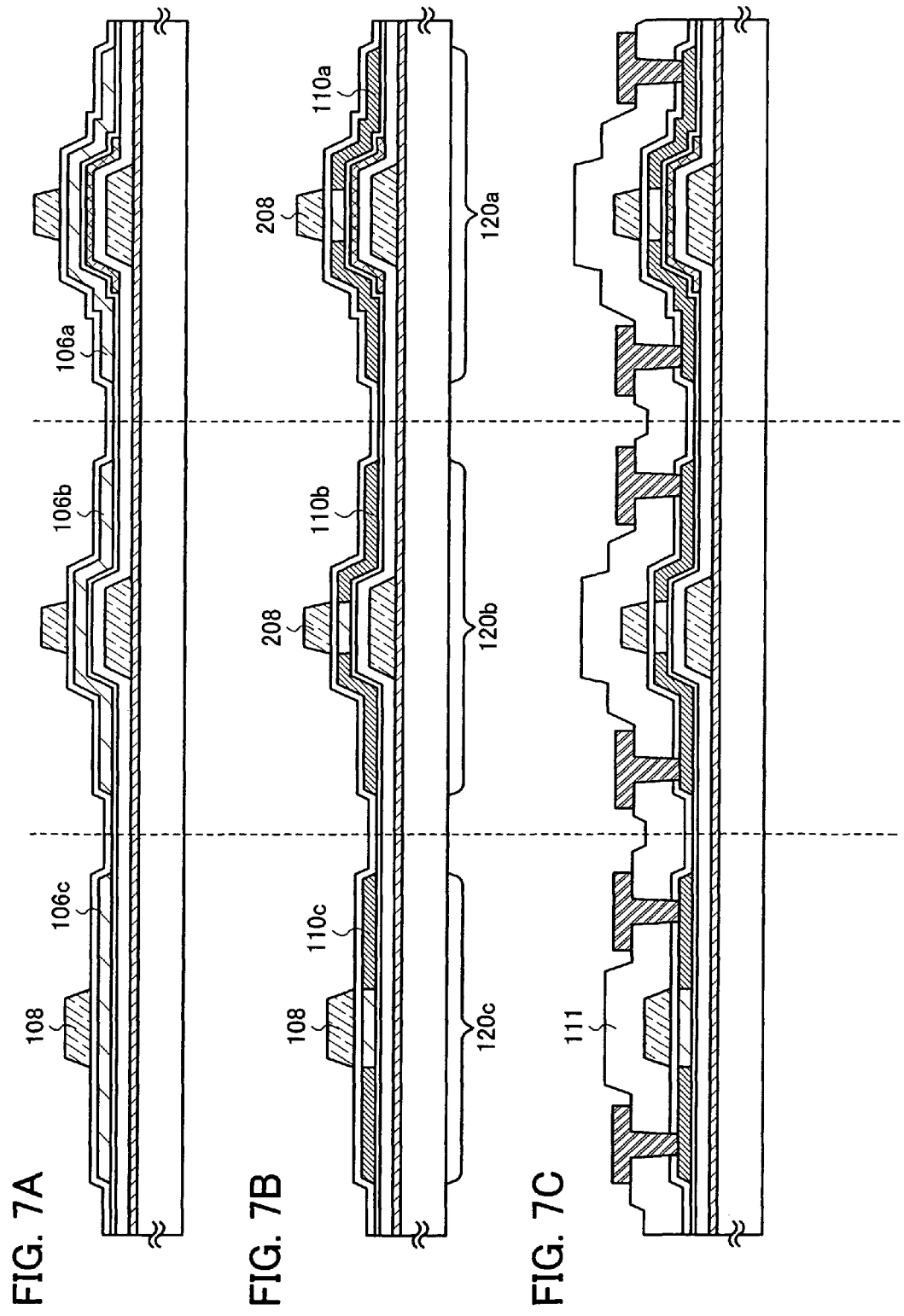

306a  304  302  305  306b  303

306a  304  302  302  305  306b  303

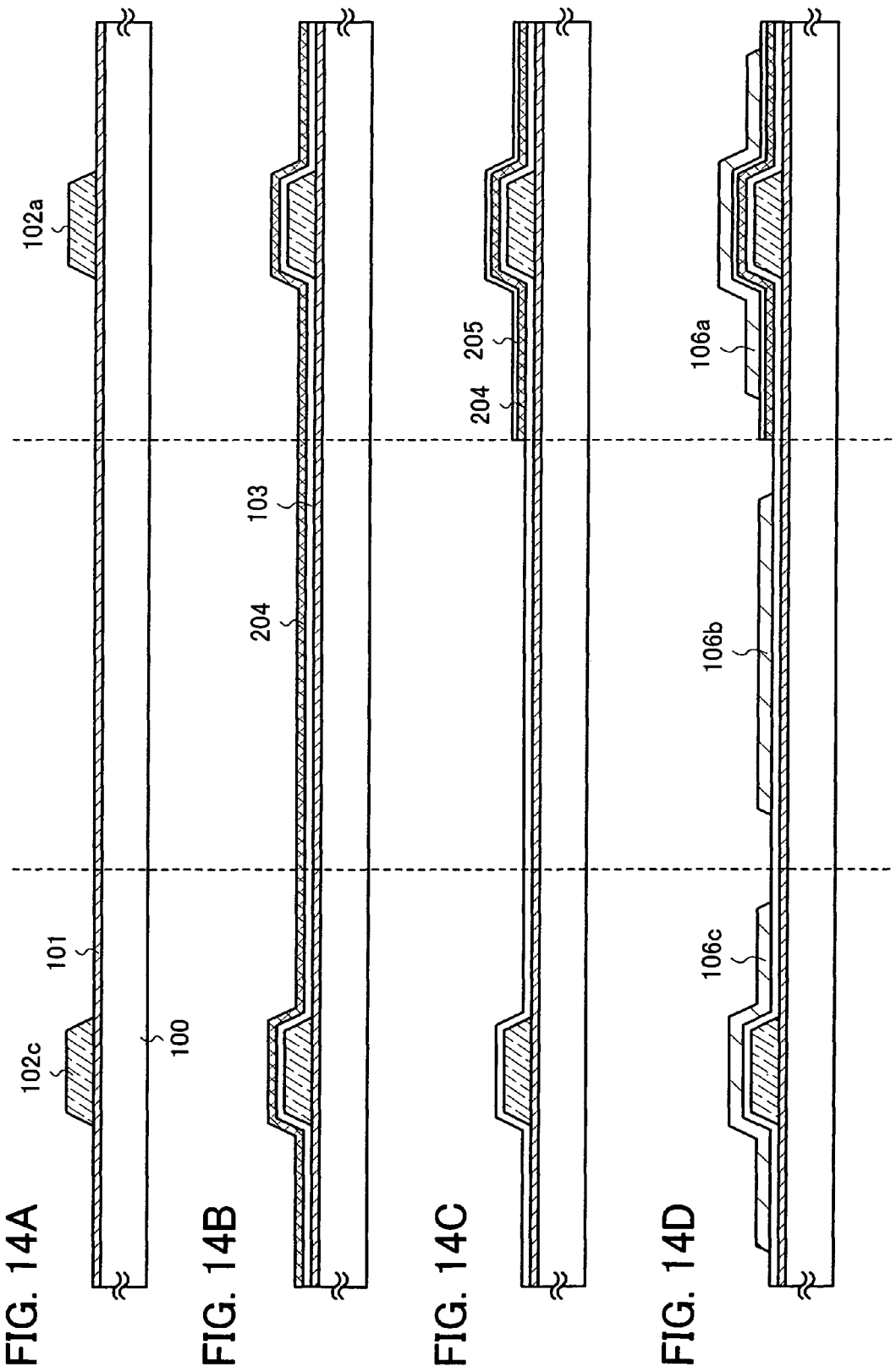

MANUFACTURING METHOD OF SEMICONDUCTOR DEVICE

TECHNICAL FIELD

The present invention relates to a semiconductor device and a manufacturing method thereof. In particular, the invention relates to a semiconductor device including a semiconductor memory element and a manufacturing method thereof.

BACKGROUND ART

In recent years, multifunctional and high-performance small semiconductor devices have been rapidly developed, which are typified by mobile devices such as a mobile computer and a mobile phone. With the development of these semiconductor devices, a transistor-type semiconductor memory element (hereinafter also referred to as a "memory transistor") has attracted attention as a memory included in the semiconductor devices.

As one of the semiconductor memory elements, the market of nonvolatile memories has been growing, to which data can be electrically rewritten and stored after the power supply is shut off. The nonvolatile memories have a structure similar to MOS transistors and are characterized in that a region capable of storing charge for a long time is provided over a channel forming region. In a floating gate nonvolatile memory, charge is injected into a charge accumulation layer (floating gate) through a tunnel insulating film over a channel forming region and stored. In a MONOS (metal-oxide-nitride-oxide semiconductor) nonvolatile memory, charge is trapped in a charge accumulation layer or silicon cluster is used as a charge carrier.

In a memory transistor included in such a nonvolatile memory, a tunnel insulating film formed between a semiconductor layer and a charge accumulation layer is required to be as thin as possible. This is because the tunnel insulating film is required to be thin enough that a tunnel current flows therethrough.

Transistors formed over the same substrate as a memory transistor have different configurations depending on the circuits including the transistors. For example, since a transistor provided in a logic circuit is required to operate at high speed, it is necessary to make its gate insulating film thin. On the other hand, a transistor provided in a circuit for controlling (writing, erasing, reading, and the like) a memory transistor is applied with a voltage as high as that applied to the memory transistor; therefore, it is necessary to make its gate insulating film thick in order to prevent damage to the transistor.

In Patent Document 1, a pixel portion, a driver circuit portion, and a memory portion are formed over the same substrate, and the thickness of a gate insulating film of the memory transistor is made to be smaller than those of gate insulating films of the pixel portion and the driver circuit portion.

[Patent Document 1] Japanese Published Patent Application No. 2000-356788

DISCLOSURE OF INVENTION

When a memory transistor and a transistor in a peripheral circuit are formed over the same substrate, it is necessary to separately form a tunnel insulating film of the memory transistor and a gate insulating film of the transistor in the peripheral circuit, since the tunnel insulating film and the gate insulating film are different in structure and thickness. When an unnecessary insulating film formed over a semiconductor film is removed by etching in order to separately form insulating films, the surface of the semiconductor film may be damaged by etching, leading to characteristic defects. There is also a problem of increase in steps with the removal of an unnecessary insulating film.

In view of the foregoing problems, it is an object of the invention to simplify the process even when a memory transistor and a transistor which has a gate insulating film with a thickness different from that in the memory transistor are formed over the same substrate. It is another object of the invention to suppress characteristic defects even when a memory transistor and a transistor which has a gate insulating film with a thickness different from that in the memory transistor are formed over the same substrate. It is a still further object of the invention to suppress characteristic defects and reduce a writing voltage and an erasing voltage even when a memory transistor and a transistor which has a gate insulating film with a thickness different from that in the memory transistor are formed over the same substrate.

A method for manufacturing a semiconductor device of the invention includes the steps of: forming a first conductive film and a second conductive film over a substrate; forming a first insulating film over the first conductive film and the second conductive film; selectively forming a charge accumulation layer over the first conductive film with the first insulating film interposed therebetween; forming a second insulating film over the first insulating film and the charge accumulation layer; forming over the second insulating film a first semiconductor film that overlaps the first conductive film, a second semiconductor film that overlaps the second conductive film, and a third semiconductor film that does not overlap either the first conductive film or the second conductive film; forming a third insulating film over the first semiconductor film, the second semiconductor film, and the third semiconductor film; and forming a third conductive film over the third semiconductor film with the third insulating film interposed therebetween. After forming the third conductive film, a resist may be formed over the first semiconductor film and the second semiconductor film, and an impurity element may be introduced into the first semiconductor film, the second semiconductor film, and the third semiconductor film using the resist and the third conductive film as masks. The second insulating film and the third insulating film are formed to have a thickness smaller than that of the first insulating film.

A method for manufacturing a semiconductor device of the invention includes the steps of: forming a first conductive film and a second conductive film over a substrate; forming a first insulating film over the first conductive film and the second conductive film; selectively forming a charge accumulation layer over the first conductive film with the first insulating film interposed therebetween; forming a second insulating film over the first insulating film and the charge accumulation layer; forming over the second insulating film a first semiconductor film that overlaps the first conductive film, a second semiconductor film that overlaps the second conductive film, and a third semiconductor film that does not overlap either the first conductive film or the second conductive film; forming a third insulating film over the first semiconductor film, the second semiconductor film, and the third semiconductor film; and forming over the third insulating film a third conductive film that overlaps the third semiconductor film, a fourth conductive film that overlaps the first semiconductor film, and a fifth conductive film that overlaps the second semiconductor film. After forming the third conductive film, the fourth conductive film, and the fifth conductive film, an impurity element may be introduced into the first semiconductor film, the second semiconductor film, and the third semiconductor film using the third to fifth conductive films as masks. The second insulating film and the third insulating film are formed to have a thickness smaller than that of the first insulating film.

A method for manufacturing a semiconductor device of the invention includes the steps of: forming a first conductive film and a second conductive film over a substrate; forming a first insulating film over the first conductive film and the second conductive film; removing the first insulating film formed over the first conductive film; forming a second insulating film over the first conductive film and the first insulating film; selectively forming a charge accumulation layer over the first conductive film with the second insulating film interposed therebetween; selectively forming a tunnel insulating film over the charge accumulation layer; forming over the tunnel insulating film a first semiconductor film that overlaps the first conductive film; forming over the second insulating film a second semiconductor film that overlaps the second conductive film, and a third semiconductor film that does not overlap either the first conductive film or the second conductive film; forming a third insulating film over the first semiconductor film, the second semiconductor film, and the third semiconductor film; and forming a third conductive film over the third semiconductor film with the third insulating film interposed therebetween. After forming the third conductive film, a resist may be formed over the first semiconductor film and the second semiconductor film, and an impurity element may be introduced into the first semiconductor film, the second semiconductor film, and the third semiconductor film using the resist and the third conductive film as masks. The second insulating film and the third insulating film are formed to have a thickness smaller than that of the first insulating film.

A method for manufacturing a semiconductor device of the invention includes the steps of: forming a first conductive film and a second conductive film over a substrate; forming a first insulating film over the first conductive film and the second conductive film; removing the first insulating film formed over the first conductive film; forming a second insulating film over the first conductive film and the first insulating film; selectively forming a charge accumulation layer over the first conductive film with the second insulating film interposed therebetween; selectively forming a tunnel insulating film over the charge accumulation layer; forming over the tunnel insulating film a first semiconductor film that overlaps the first conductive film; forming over the second insulating film a second semiconductor film that overlaps the second conductive film, and a third semiconductor film that does not overlap either the first conductive film or the second conductive film; forming a third insulating film over the first semiconductor film, the second semiconductor film, and the third semiconductor film; and forming over the third insulating film a third conductive film that overlaps the third semiconductor film, a fourth conductive film that overlaps the first semiconductor film, and a fifth conductive film that overlaps the second semiconductor film. After forming the third conductive film, the fourth conductive film, and the fifth conductive film, an impurity element may be introduced into the first semiconductor film, the second semiconductor film, and the third semiconductor film using the third to fifth conductive films as masks. The second insulating film and the third insulating film are formed to have a thickness smaller than that of the first insulating film.

A semiconductor device of the invention includes a memory transistor, a first transistor, and a second transistor that are formed over a substrate. The memory transistor includes a first conductive film formed over the substrate, a first insulating film formed over the first conductive film, a charge accumulation layer formed over the first insulating film, a second insulating film that is formed over the charge accumulation layer and has a thickness smaller than that of the first insulating film, and a first semiconductor film formed over the second insulating film. The first transistor includes a second conductive film formed over the substrate, the first insulating film formed over the second conductive film, the second insulating film formed over the first insulating film, and a second semiconductor film formed over the second insulating film. The second transistor includes a third semiconductor film formed over the substrate with the first insulating film and the second insulating film interposed therebetween, a third insulating film that is formed over the third semiconductor film and has a thickness smaller than that of the first insulating film, and a third conductive film formed over the third insulating film.

A semiconductor device of the invention includes a memory transistor, a first transistor, and a second transistor that are formed over a substrate. The memory transistor includes a first conductive film formed over the substrate, a second insulating film formed over the first conductive film, a charge accumulation layer formed over the second insulating film, a tunnel insulating film formed over the charge accumulation layer, and a first semiconductor film formed over the tunnel insulating film. The first transistor includes a second conductive film formed over the substrate, a first insulating film that is formed over the second conductive film and has a thickness greater than that of the second insulating film, the second insulating film formed over the first insulating film, and a second semiconductor film formed over the second insulating film. The second transistor includes a third semiconductor film formed over the substrate with the first insulating film and the second insulating film interposed therebetween, a third insulating film that is formed over the third semiconductor film and has a thickness smaller than that of the first insulating film, and a third conductive film formed over the third insulating film.

A memory transistor is formed over the same substrate as a plurality of thin film transistors that have gate insulating films with different thicknesses in the invention. Furthermore, the memory transistor and some of the plurality of thin film transistors are provided to have a bottom gate structure while the other thin film transistors are provided to have a top gate structure. As a result, simplification of a manufacturing process is achieved.

The invention also includes a structure in which a memory transistor is formed over the same substrate as a plurality of thin film transistors that have gate insulating films with different thicknesses. Moreover, the thin film transistors have either a top gate structure or a bottom gate structure depending on the thicknesses of gate insulating films. Accordingly, an etching step to remove an insulating film formed in contact with a semiconductor film can be omitted, thereby reducing characteristic defects of the transistors.

A memory transistor has a bottom gate structure and electrons are injected or released into/from a charge accumulation layer by utilizing an edge of a gate electrode. As a result, a writing voltage and an erasing voltage can be reduced.

BRIEF DESCRIPTION OF THE DRAWINGS

In the accompanying drawings:

FIGS. 1A to 1D show an example of a method for manufacturing a semiconductor device of the invention;

FIGS. 2A to 2D show an example of a method for manufacturing a semiconductor device of the invention;

FIGS. 4A to 4D show an example of a method for manufacturing a semiconductor device of the invention;

FIGS. 6A and 6B show an example of a semiconductor device of the invention;

FIGS. 7A to 7C show an example of a method for manufacturing a semiconductor device of the invention;

FIGS. 14A to 14D show an example of a method for manufacturing a semiconductor device of the invention.

BEST MODE FOR CARRYING OUT THE INVENTION

Figures 3A, 3B, 3C:
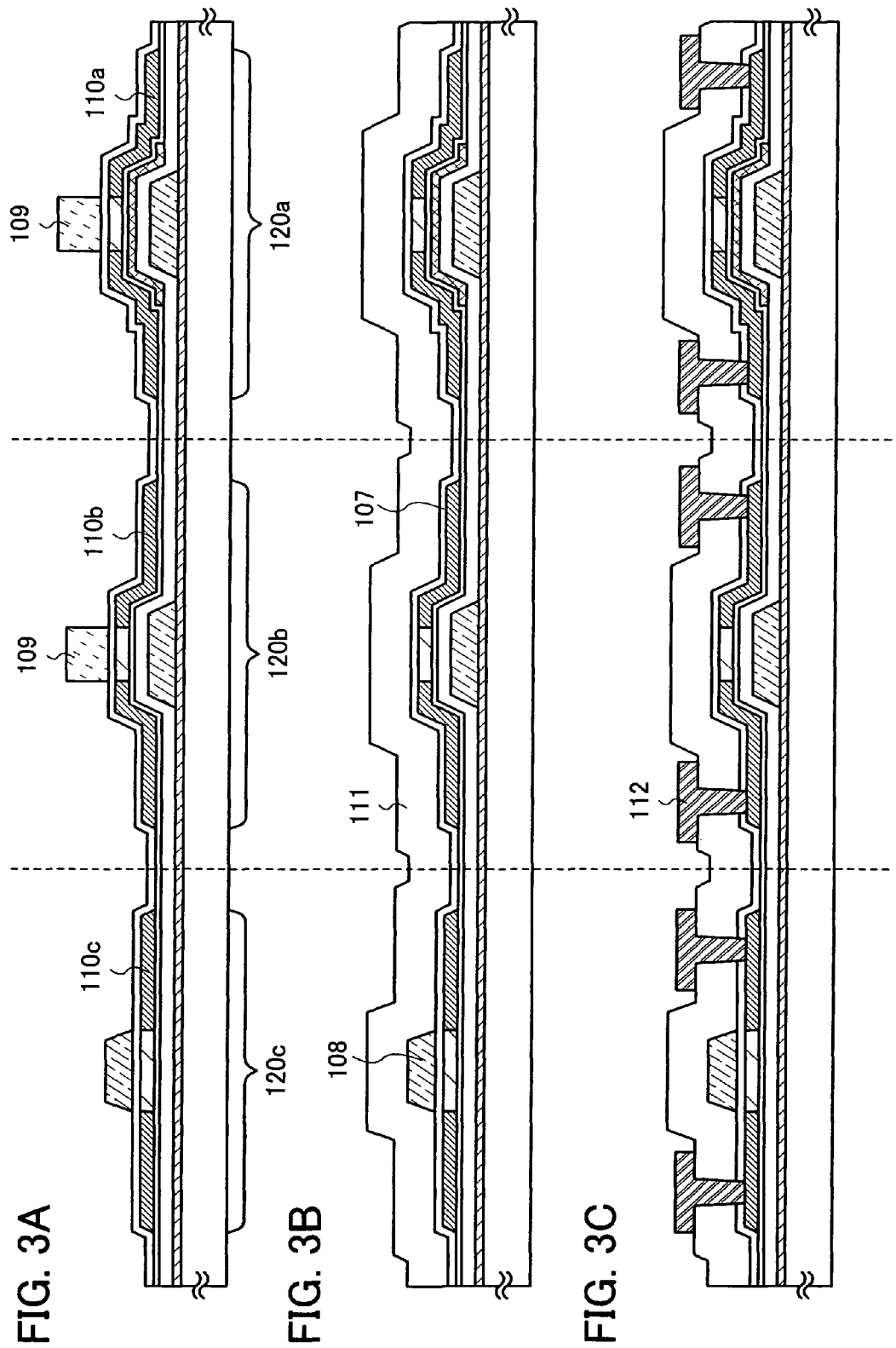
FIGS. 3A to 3C show an example of a method for manufacturing a semiconductor device of the invention.

Although the invention will be described by way of embodiment modes with reference to the accompanying drawings, it is to be understood that various changes and modifications will be apparent to those skilled in the art. Therefore, unless such changes and modifications depart from the scope of the invention, they should be construed as being included therein. Note that in the drawings of this specification, the identical portions or portions having a similar function are denoted by the identical reference numerals, and description thereon may be omitted.

Embodiment Mode 1

In this embodiment mode, an example of a semiconductor device including a memory transistor and a method for manufacturing the semiconductor device is described with reference to FIGS. 1A to 1D, FIGS. 2A to 2D, and FIGS. 3A to 3C.

Described hereinafter is a case in which a memory transistor is formed over the same substrate as a thin film transistor that is required to have high withstand voltage (high-voltage thin film transistor) and a thin film transistor that is required to operate at high speed (high-speed thin film transistor). A gate insulating film of the high-voltage thin film transistor is formed to have a thickness greater than that of a gate insulating film of the high-speed thin film transistor.

First, conductive films 102a and 102b are formed over a substrate 100 with an insulating film 101 interposed therebetween (see FIG. 1A).

The substrate 100 may be a glass substrate, a metal substrate, a stainless steel substrate, a plastic substrate having heat resistance to the processing temperature of this process, or the like. Such a substrate is not particularly limited in area and shape. For example, a rectangular substrate with a side of 1 meter or longer significantly increases productivity. This is a major advantage as compared to the case of using a circular silicon substrate. Thus, even when an integrated circuit portion occupies a large area, it can be produced at a lower cost as compared to the case of using a silicon substrate.

The insulating film 101 is formed by CVD, sputtering or the like so as to have a single layer structure or a stacked-layer structure using a film containing an oxide of silicon or a nitride of silicon (e.g., a silicon oxide ($SiO_x$) film, a silicon oxynitride ($SiO_xN_y$) (x>y) film, a silicon nitride ($SiN_x$) film, a silicon nitride oxide ($SiN_xO_y$) (x>y) film, or the like).

The conductive films 102a and 102b can be formed using a film containing an element selected from tantalum (Ta), tungsten (W), titanium (Ti), molybdenum (Mo), aluminum (Al), copper (Cu), nickel (Ni), silicon (Si), and the like, a film containing a nitride of these elements (typically, a tantalum nitride film, a tungsten nitride film, or a titanium nitride film), an alloy film of these elements (typically, an Mo—W alloy film or an Mo—Ta alloy film), or a silicide film of these elements (typically, a tungsten silicide film, a titanium silicide film, or a nickel silicide film). The conductive films 102a and 102b may have a stacked-layer structure of a plurality of conductive films. For example, a tantalum nitride film with a thickness of 20 to 100 nm and a tungsten film with a thickness of 100 to 400 nm may be stacked in this order. Since tungsten and tantalum nitride have high heat resistance, the conductive films may be subjected to heat treatment for thermal activation. The conductive films 102a and 102b may be directly formed over the substrate 100 without the insulating film 101 interposed therebetween.

The conductive film 102a functions as the gate electrode of the memory transistor, while the conductive film 102b functions as the gate electrode of the high-voltage thin film transistor.

Next, a first insulating film 103 is formed over the substrate 100 and the conductive films 102a and 102b, and a charge accumulation layer 104 is formed over the first insulating film 103 (see FIG. 1B).

The first insulating film 103 is formed by CVD, sputtering or the like so as to have a single layer structure or a stacked-layer structure using a film containing an oxide of silicon or a nitride of silicon (e.g., a silicon oxide film, a silicon oxynitride film, a silicon nitride film, a silicon nitride oxide film, or the like).

The first insulating film 103 serves as a part of a gate insulating film of the high-voltage thin film transistor, and as an insulating film provided between a charge accumulation layer and the gate electrode of the memory transistor. In this embodiment mode, the first insulating film 103 is formed of a silicon oxide film or a silicon oxynitride film with a thickness of 20 to 60 nm, and preferably 30 to 55 nm. When the insulating film is thus shared by the memory transistor and the high-voltage thin film transistor, simplification of the process is achieved.

The charge accumulation layer 104 can be formed by CVD, sputtering or the like. The charge accumulation layer 104 is provided as an insulating film having a defect of trapping charge in the film, or an insulating film containing conductive particles or semiconductor particles such as silicon. For example, the charge accumulation layer 104 can be formed as an insulating film containing nitrogen, e.g., a silicon nitride film, a silicon nitride oxide film, or a silicon oxynitride film, or these insulating films containing conductive particles or semiconductor particles. When the charge accumulation layer 104 is thus formed as an insulating film containing nitrogen, a MONOS memory transistor can be obtained.

Note that the memory transistor is not limited to the MONOS type, and the charge accumulation layer 104 may be formed as a conductive film. For example, the charge accumulation layer 104 can be formed as a film containing an element selected from tungsten (W), tantalum (Ta), titanium (Ti), molybdenum (Mo), chromium (Cr), and silicon (Si), a film containing a nitride of these elements (typically, a tungsten nitride film, a tantalum nitride film, or a titanium nitride film), or a silicide film of these elements (typically, a tungsten silicide film, or a titanium silicide film). A silicon film may be added with an impurity such as phosphorus and boron. When the charge accumulation layer 104 is thus formed as a conductive film, a floating gate memory transistor can be obtained.

In this embodiment mode, the charge accumulation layer 104 is formed of tungsten (W) with a thickness of 5 to 100 nm, and preferably 10 to 50 nm. Namely, this embodiment mode shows a case of a floating gate memory transistor.

Next, the charge accumulation layer 104 is selectively removed to remain partially (see FIG. 1C). Here, etching is performed so as to leave at least the charge accumulation layer provided over the conductive film 102a of the memory transistor. The charge accumulation layer 104 may have a width smaller than that of the conductive film 102a, or a width larger than the conductive film 102a as shown in FIG. 1C.

Then, a second insulating film 105 is formed over the remaining charge accumulation layer 104 and the exposed first insulating film 103, and a semiconductor film 106 is formed over the second insulating film 105 (see FIG. 1D).

The second insulating film 105 is formed by CVD, sputtering or the like so as to have a single layer structure or a stacked-layer structure of a film containing an oxide of silicon or a nitride of silicon (e.g., a silicon oxide film, a silicon oxynitride film, a silicon nitride film, a silicon nitride oxide film, or the like).

The second insulating film 105 functions as a tunnel insulating film of the memory transistor. In this embodiment mode, the second insulating film 105 is formed of silicon oxide or silicon oxynitride with a thickness of 5 to 20 nm, and preferably 5 to 15 nm. The second insulating film 105 serves as a part of the gate insulating film of the high-voltage thin film transistor. In this embodiment mode, the gate insulating film of the high-voltage thin film transistor has a stacked-layer structure of the first insulating film 103 and the second insulating film 105. When the insulating film is thus provided so as to serve as the insulating film of the memory transistor and the gate insulating film of the thin film transistor, simplification of the process is achieved.

The semiconductor film 106 is formed by sputtering, LPCVD, plasma CVD or the like so as to have a thickness of 25 to 200 nm (preferably 30 to 150 nm). The semiconductor film 106 may be formed as an amorphous silicon film, for example.

The amorphous semiconductor film 106 may be irradiated with laser light to be crystallized. The crystallization of the amorphous semiconductor film 106 may be performed by combining laser irradiation, thermal crystallization using RTA or an annealing furnace, and thermal crystallization using a metal element that promotes crystallization.

In this embodiment mode, the semiconductor film 106 is crystallized and then etched into a desired shape, thereby forming crystalline semiconductor films 106a, 106b, and 106c (see FIG. 2A). The semiconductor film 106a is formed so as to overlap the conductive film 102a, the semiconductor film 106b is formed so as to overlap the conductive film 102b, and the semiconductor film 106c is formed so as not to overlap either the conductive film 102a or the conductive film 102b.

The semiconductor film 106a functions as a channel forming region of the memory transistor, the semiconductor film 106b functions as a channel forming region of the high-voltage thin film transistor, and the semiconductor film 106c functions as a channel forming region of the high-speed thin film transistor.

Then, a third insulating film 107 is formed over the semiconductor films 106a to 106c (see FIG. 2B).

The third insulating film 107 is formed by CVD, sputtering or the like so as to have a single layer structure or a stacked-layer structure of a film containing an oxide of silicon or a nitride of silicon (e.g., a silicon oxide film, a silicon oxynitride film, a silicon nitride film, a silicon nitride oxide film, or the like). Alternatively, the third insulating film 107 may be formed by oxidizing or nitriding the surfaces of the semiconductor films by plasma treatment. For example, the third insulating film 107 is formed by plasma treatment using a mixed gas of a rare gas such as He, Ar, Kr and Xe, and oxygen, nitrogen oxide, ammonia, nitrogen, hydrogen, or the like. In this case, plasma is excited by introduction of microwaves, so that plasma with a low electron temperature and a high density can be generated. The surfaces of the semiconductor films can be oxidized or nitrided by oxygen radicals (there may also be OH radicals) or nitrogen radicals (there may also be NH radicals) that are generated by the high-density plasma. Alternatively, after forming a film containing an oxide of silicon or a nitride of silicon by CVD, sputtering or the like, the obtained insulating film may be subjected to plasma treatment.

The third insulating film 107 functions as a gate insulating film of the high-speed thin film transistor. In this embodiment mode, the third insulating film 107 is formed as a silicon oxide film or a silicon oxynitride film with a thickness of 3 to 25 nm, and preferably 5 to 20 nm. In other words, the third insulating film 107 is formed to have a thickness smaller than that of the gate insulating film of the high-voltage thin film transistor.

Then, a conductive film 108 is formed over the third insulating film 107 (see FIG. 2C).

The conductive film 108 has a single layer structure or a stacked-layer structure of a film containing an element selected from tantalum (Ta), tungsten (W), titanium (Ti), molybdenum (Mo), aluminum (Al), copper (Cu), nickel (Ni), silicon (Si), and the like, a film containing a nitride of these elements (typically, a tantalum nitride film, a tungsten nitride film, or a titanium nitride film), an alloy film of these elements (typically, an Mo—W alloy film or an Mo—Ta alloy film), or a silicide film of these elements (typically, a tungsten silicide film, a titanium silicide film, or a nickel silicide film).

Then, the conductive film 108 is etched to remain partially over the semiconductor film 106c (see FIG. 2D). The remaining conductive film 108 functions as a gate electrode of the high-speed thin film transistor.

Next, resists 109 are formed to overlap parts of the semiconductor films 106a and 106b. An impurity element is introduced into the semiconductor films 106a to 106c using the resists 109 and the conductive film 108 as masks, thereby forming impurity regions 110a to 110c that function as source regions or drain regions (see FIG. 3A).

As a result, a bottom gate memory transistor 120a, a bottom gate high-voltage thin film transistor 120b, and a top gate high-speed thin film transistor 120c can be obtained.

The impurity element to be introduced is either an n-type impurity element or a p-type impurity element. As the n-type impurity element, phosphorus (P), arsenic (As) or the like can be used. As the p-type impurity element, boron (B), aluminum (Al), gallium (Ga) or the like can be used. In this embodiment mode, a high concentration of phosphorus (P) is introduced into the semiconductor films 106a to 106c, thereby forming the n-type impurity regions 110a to 110c. Note that boron (B) may be introduced into the semiconductor films to form p-type impurity regions.

The impurity region 110c in the semiconductor film 106c can be formed in a self-alignment manner since the conductive film 108 can be used as a mask.

As set forth above, a memory transistor and some of thin film transistors that are formed over the same substrate are fabricated in a bottom gate structure while the other thin film transistors are formed as a top gate structure. Accordingly, even when a tunnel insulating film of a memory transistor and gate insulating films of transistors are different in thickness, it is possible to omit the etching step of an unnecessary gate insulating film and suppress damage to a semiconductor film due to etching.

Then, an insulating film 111 functioning as an interlayer insulating film is formed over the conductive film 108 and the third insulating film 107 (see FIG. 3B).

The insulating film 111 is formed by CVD, sputtering, SOG, droplet discharging, screen printing or the like so as to have a single layer structure or a stacked-layer structure using an inorganic material such as an oxide of silicon and a nitride of silicon, an organic material such as polyimide, polyamide, a benzocyclobutene-based resin, an acrylic polymer, and an epoxy resin, a siloxane material, or the like. For example, the insulating film 111 may have a two-layer structure of a silicon nitride oxide film and a silicon oxynitride film. Note that the siloxane material is a material including a Si—O—Si bond. Siloxane is composed of a skeleton formed by the bond of silicon (Si) and oxygen (O), in which an organic group containing at least hydrogen (such as an alkyl group and aromatic hydrocarbon) is used as a substituent. Alternatively, a fluoro group may be included in the organic group.

Then, conductive films 112 are formed over the insulating film 111, which can function as source electrodes or drain electrodes of the memory transistor 120a, the high-voltage thin film transistor 120b, and the high-speed thin film transistor 120c (see FIG. 3C).

The conductive films 112 are formed by CVD, sputtering or the like so as to have a single layer structure or a stacked-layer structure using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy or a compound containing such an element as its main component. The alloy containing aluminum as its main component corresponds to, for example, a material that contains aluminum as its main component and also contains nickel, or a material that contains aluminum as its main component and also contains nickel and one or both of carbon and silicon.

Through the above steps, the semiconductor device including the memory transistor can be obtained.

Note that various types of transistors can be applied to the thin film transistors of this embodiment mode. For example, a multi-gate structure including two or more gate electrodes may be adopted. In the multi-gate structure, channel regions are connected in series; thus the structure is formally equivalent to that a plurality of transistors are connected in series. When the multi-gate structure is used, the off-current can be reduced, and the withstand voltage of the transistor can be increased, leading to improved reliability. In addition, even if the drain-source voltage fluctuates when the transistor operates in a saturation region, the drain-source current does not fluctuate significantly, and stable characteristics can be obtained.

It is also possible to adopt a structure in which an LDD region is formed in a semiconductor film between a channel forming region and an impurity region functioning as a source region or a drain region. When the LDD region is provided, the off-current can be reduced, and the withstand voltage of the transistor can be increased, leading to improved reliability. In addition, even if the drain-source voltage fluctuates when the transistor operates in a saturation region, the drain-source current does not fluctuate significantly, and stable characteristics can be obtained.

This embodiment mode can be combined with any structure of the semiconductor devices described in other embodiment modes of this specification.

Embodiment Mode 2

In this embodiment mode, a semiconductor device and a manufacturing method thereof, which are different from those shown in the above embodiment mode, are described with reference to the drawings. Specifically, a MONOS memory transistor is described, in which an insulating film (insulating film between a gate electrode and a charge accumulation layer) of a memory transistor has a thickness smaller than that of a gate insulating film of a high-voltage thin film transistor.

First, the conductive films 102a and 102b are formed over the substrate 100 with the insulating film 101 interposed therebetween (see FIG. 4A). The conductive film 102a functions as the gate electrode of the memory transistor while the conductive film 102b functions as the gate electrode of the high-voltage thin film transistor.

Then, the first insulating film 103 is formed over the substrate 100 and the conductive films 102a and 102b (see FIG. 4B). In this embodiment mode, the first insulating film 103 functions as a part of the gate insulating film of the high-voltage thin film transistor. The first insulating film 103 is formed of silicon oxynitride with a thickness of 10 to 60 nm, and preferably 20 to 40 nm.

The first insulating film 103 formed over the conductive film 102a is removed (see FIG. 4C).

Next, a second insulating film 203 is formed over the conductive film 102a and the first insulating film 103, and a charge accumulation layer 204 is formed over the second insulating film 203 (see FIG. 4D). The charge accumulation layer 204 is formed by CVD, sputtering or the like as an insulating film containing nitrogen, e.g., a silicon nitride film, a silicon nitride oxide film, or a silicon oxynitride film, or these insulating films containing conductive particles or semiconductor particles. In this embodiment mode, the charge accumulation layer 204 is formed of silicon nitride with a thickness of 3 to 40 nm, and preferably 5 to 20 nm. The second insulating film 203 is formed by CVD, sputtering or the like so as to have a single layer structure or a stacked-layer structure as a silicon oxide film, a silicon oxynitride film or the like. In this embodiment mode, the second insulating film 203 is formed of silicon oxynitride with a thickness of 3 to 15 nm, and preferably 5 to 10 nm. Note that the second insulating film 203 is not necessarily provided, and in that case, an MNOS transistor is obtained.

Figure 5A:
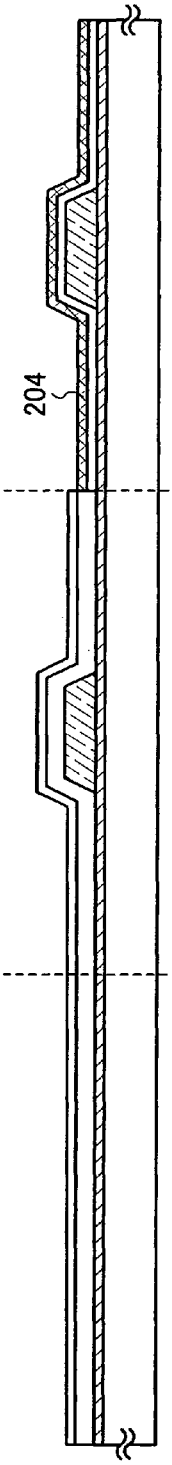
FIGS. 5A to 5D show an example of a method for manufacturing a semiconductor device of the invention.

Then, the charge accumulation layer 204 is selectively removed to remain partially (see FIG. 5A). In this embodiment mode, etching is performed so as to leave at least the charge accumulation layer formed over the conductive film 102a of the memory transistor. The charge accumulation layer 204 is an insulating film in this embodiment mode; thus, the charge accumulation layer 204 is not necessarily removed, and the charge accumulation layer 204 between memory transistors may be removed to be separated for each memory transistor.

Figure 5B:
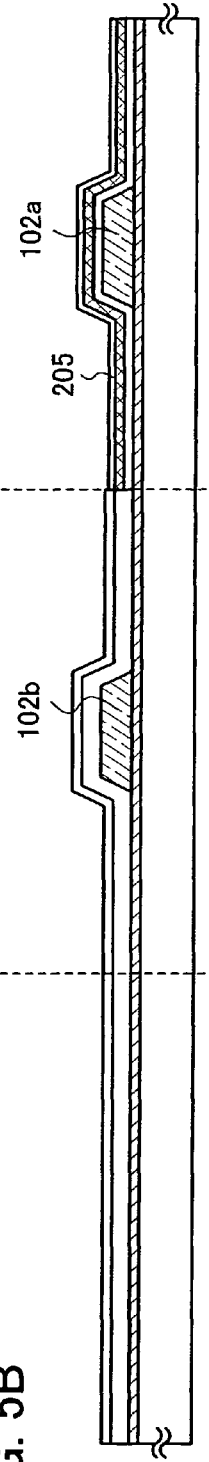

Next, an insulating film 205 is formed at least over the conductive film 102a (see FIG. 5B). Since the insulating film 205 functions as a tunnel insulating film of the MONOS memory transistor, it is preferably formed to have a small thickness. In this embodiment mode, the insulating film 205 is formed by oxidizing the surface of the charge accumulation layer 204 by plasma treatment. For example, the insulating film 205 is formed by plasma treatment using a mixed gas of a rare gas such as He, Ar, Kr and Xe, and oxygen, nitrogen oxide, hydrogen, or the like. In this case, plasma is excited by introduction of microwaves, so that plasma with a low electron temperature and a high density can be generated. The surface of the charge accumulation layer 204 can be oxidized by oxygen radicals (there may also be OH radicals) that are generated by the high-density plasma. In this embodiment mode, a silicon oxide film or a silicon oxynitride film with a thickness of 1 to 5 nm, and preferably 2 to 4 nm is formed as the insulating film 205 by plasma treatment.

In addition, the surface of the second insulating film 203 can be modified by plasma treatment.

Although this embodiment mode shows the case in which the insulating film 205 is formed by plasma treatment, a silicon oxide film or a silicon nitride film may be formed by CVD, sputtering or the like, and the obtained insulating film may be subjected to plasma treatment.

Figure 5C:
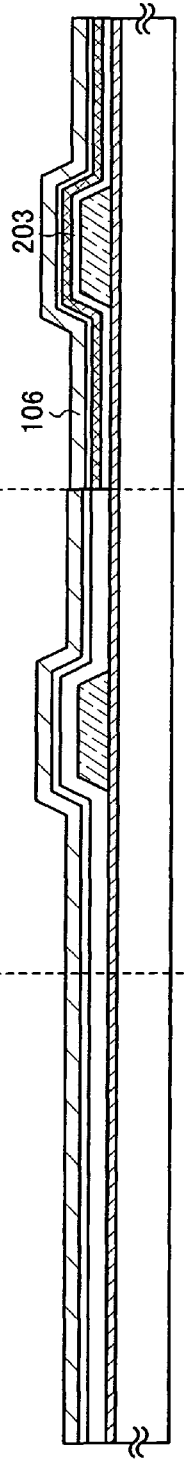

Then, the semiconductor film 106 is formed over the insulating film 205 and the second insulating film 203 (see FIG. 5C).

Figure 5D:
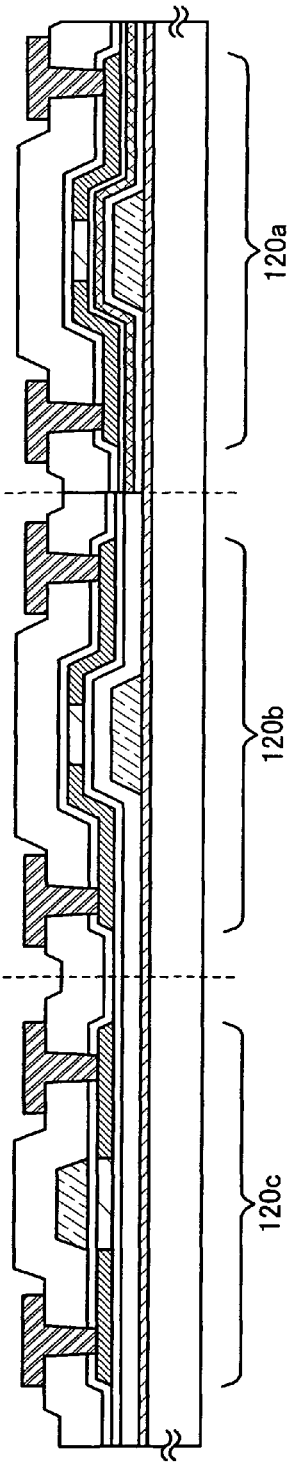

Following the same steps as those in FIGS. 2A to 2D and FIGS. 3A to 3C, the semiconductor device including the MONOS memory transistor can be obtained (see FIG. 5D). In the semiconductor device of this embodiment mode, the memory transistor 120a and the high-voltage thin film transistor 120b have a bottom gate structure, while the high-speed thin film transistor 120c has a top gate structure.

In this embodiment mode, the insulating film (the second insulating film 203 between the conductive film 102a and the charge accumulation layer 204) of the memory transistor 120a and the gate insulating film (the first insulating film 103 and the second insulating film 203) of the high-voltage thin film transistor 120b are different in thickness; thus, an unnecessary gate insulating film (i.e., the first insulating film 103 over the conductive film 102a) is etched in FIG. 4C as described above. However, damage to the semiconductor film 106 due to removal of the unnecessary gate insulating film can be ignored by adopting the bottom gate structure in the memory transistor 120a.

Although this embodiment mode shows the example in which the memory transistor and the high-voltage thin film transistor have a bottom gate structure and the high-speed thin film transistor has a top gate structure, the invention is not limited to this structure. For example, when an insulating film is arranged to be shared by the insulating film (insulating film between the gate electrode and the charge accumulation layer) of the memory transistor and by the gate insulating film of the high-speed thin film transistor, the memory transistor and the high-speed thin film transistor may have a bottom gate structure and the high-voltage thin film transistor may have a top gate structure. A manufacturing method of this case is described below with reference to FIGS. 14A to 14D and FIGS. 15A to 15C.

First, the conductive film 102a and a conductive film 102c are formed over the substrate 100 with the insulating film 101 interposed therebetween (see FIG. 14A). The conductive film 102a functions as the gate electrode of the memory transistor while the conductive film 102c functions as the gate electrode of the high-voltage thin film transistor.

Then, the first insulating film 103 is formed over the substrate 100 and the conductive films 102a and 102c, and the charge accumulation layer 204 is formed over the first insulating film 103 (see FIG. 14B). In FIGS. 14A to 14D and FIGS. 15A to 15C, the first insulating film 103 functions as the gate insulating film of the high-speed thin film transistor and as the insulating film formed between the charge accumulation layer and the gate electrode of the memory transistor.

Then, etching is performed so as to leave at least the charge accumulation layer 204 formed over the conductive film 102a, and the insulating film 205 is formed over the remaining charge accumulation layer 204 (see FIG. 14C). The insulating film 205 can be formed by oxidizing the charge accumulation layer 204 by plasma treatment. Note that the charge accumulation layer 204 is not necessarily etched.

Next, the semiconductor film 106a is formed over the insulating film 205 so as to overlap the conductive film 102a, the semiconductor film 106c is formed over the first insulating film 103 so as to overlap the conductive film 102c, and the semiconductor film 106b is formed over the first insulating film 103 so as not to overlap either the conductive film 102a or the conductive film 102c (see FIG. 14D).

Figure 15A:
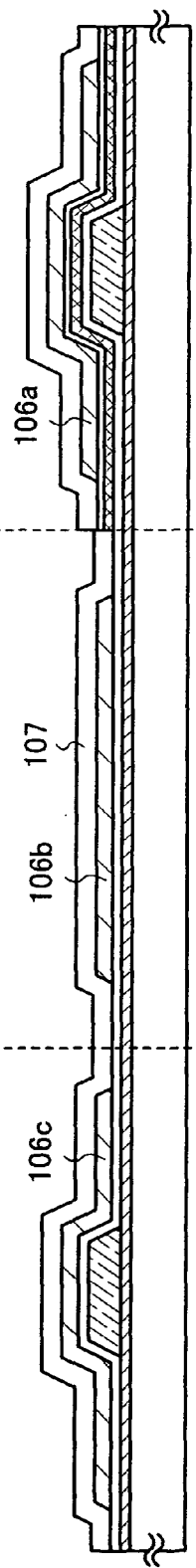
FIGS. 15A to 15C show an example of a method for manufacturing a semiconductor device of the invention.

Then, the third insulating film 107 is formed over the semiconductor films 106a to 106c (see FIG. 15A). In this case, the third insulating film 107 functions as the gate insulating film of the high-voltage thin film transistor.

Figure 15B:
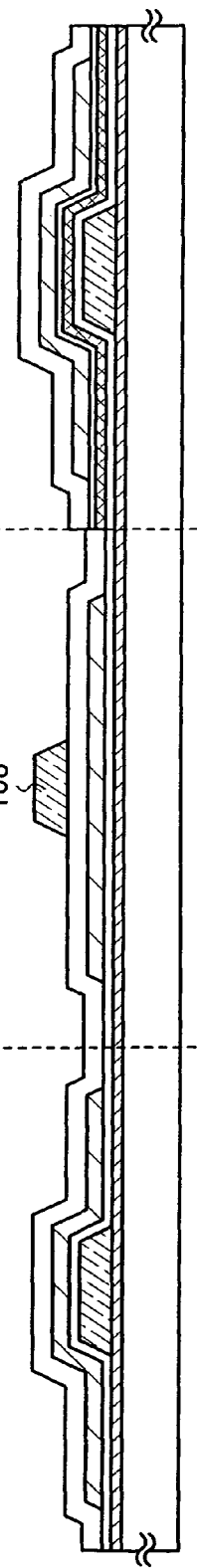

Then, the conductive film 108 is selectively formed over the third insulating film 107 (see FIG. 15B). The conductive film 108 functions as the gate electrode of the high-voltage thin film transistor.

Figure 15C:
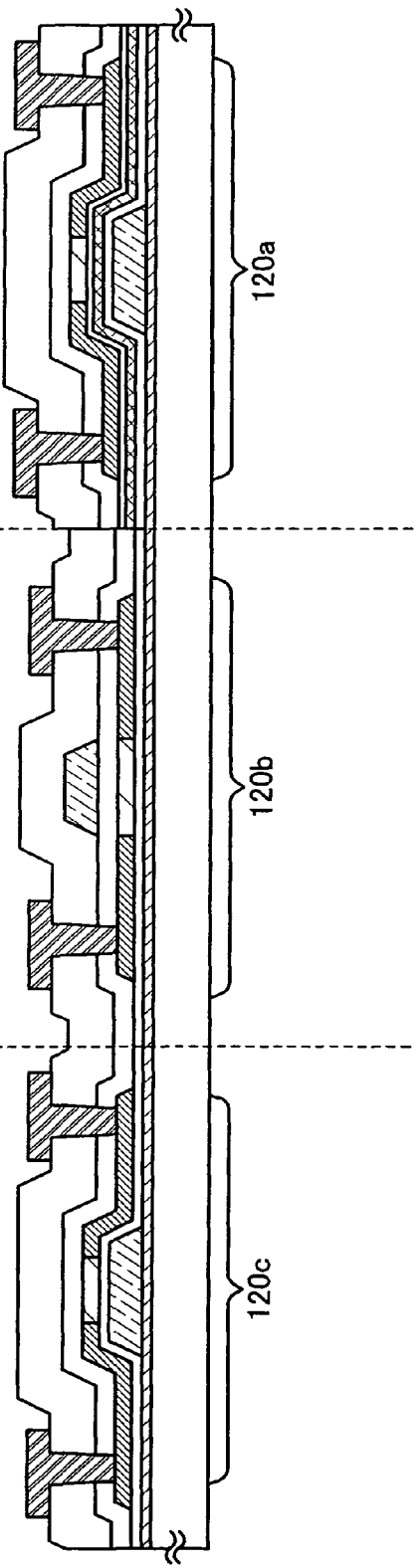

Following the same steps as those in FIGS. 3A to 3C, the memory transistor 120a and the high-speed thin film transistor 120c that have a bottom gate structure, and the high-voltage thin film transistor 120b having a top gate structure can be obtained (see FIG. 15C).

When the first insulating film 103 is thus provided so as to serve as the insulating film (first insulating film 103 between the gate electrode 102a and the charge accumulation layer 204) of the memory transistor 120a and the gate insulating film 103 of the thin film transistor (high-speed thin film transistor 120c here), simplification of the process is achieved even in the case of providing thin film transistors having gate insulating films with different thicknesses. It is also possible to omit the etching steps of an unnecessary insulating film that is formed in contact with the semiconductor film; thus damage to the semiconductor film can be prevented.

This embodiment mode can be combined with any structure of the semiconductor devices described in other embodiment modes of this specification.

Embodiment Mode 3

In this embodiment mode, a structure of a semiconductor device, which is different from that shown in the above embodiment modes, is described with reference to the drawings. Specifically, description is made on a structure in which a memory transistor and a high-voltage thin film transistor are each provided with an upper gate electrode.

The semiconductor device shown in this embodiment mode has a structure in which a conductive film 208 functioning as an upper electrode is added to the bottom gate memory transistor 120*a* and high-voltage thin film transistor 120*b* in the semiconductor device shown in FIGS. 3A to 3C (see FIG. 6A).

The conductive film 208 allows the threshold value to be controlled; thus high speed operation or low power consumption can be selected arbitrarily.

Note that the conductive film 208 functioning as an upper electrode may be added to the memory transistor 120*a* and the high-voltage thin film transistor 120*b* in the structure shown in Embodiment Mode 2 (see FIG. 6B).

A method for forming an upper gate electrode in a bottom gate memory transistor 120*a* and high-voltage thin film transistor 120*b* is described with reference to FIGS. 7A to 7C.

Following the same steps as those in FIGS. 1A to 1D and FIGS. 2A to 2C shown in Embodiment Mode 1, the conductive film 108 is selectively etched so that the conductive films 208 and 108 functioning as gate electrodes are formed over the semiconductor films 106*a*, 106*b*, and 106*c* (see FIG. 7A).

Then, an impurity element is introduced into the semiconductor films 106*a* to 106*c* using the conductive films 108 and 208 as masks, thereby forming the impurity regions 110*a* to 110*c*. As a result, the memory transistor 120*a*, the high-voltage thin film transistor 120*b*, and the high-speed thin film transistor 120*c* are obtained (see FIG. 7B).

Then, the insulating film 111 functioning as an interlayer insulating film is formed to cover the conductive films 108 and 208, and the conductive films 112 are formed over the insulating film 111, which can function as source electrodes or drain electrodes of the memory transistor 120*a*, the high-voltage thin film transistor 120*b*, and the high-speed thin film transistor 120*c* (see FIG. 7C).

This embodiment mode shows the structure in which both the memory transistor and the high-voltage thin film transistor are provided with the upper electrode; however, one of the memory transistor and the high-voltage thin film transistor may be provided with the upper electrode.

This embodiment mode can be combined with any structure of the semiconductor devices described in other embodiment modes of this specification.

Embodiment Mode 4

In this embodiment mode, a structure of the memory transistor shown in the above embodiment modes is described. Specifically, description is made on a multi-valued MONOS memory transistor having a bottom gate structure.

Figure 8A:
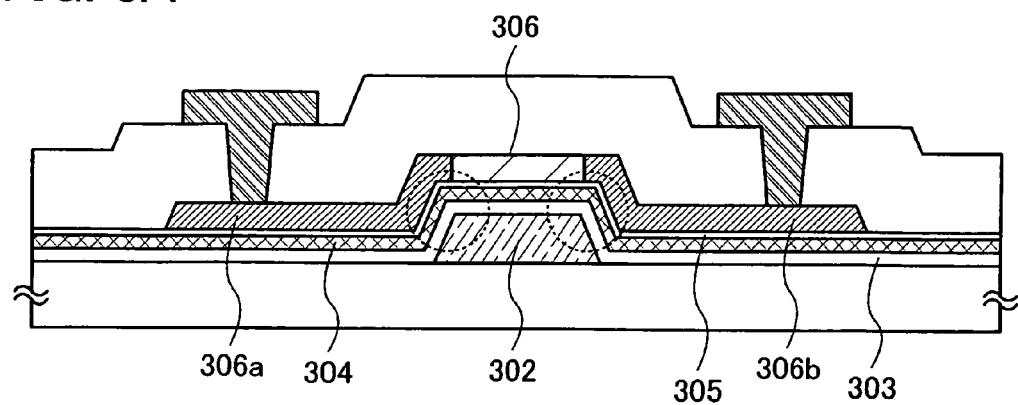
FIGS. 8A and 8B show an example of a semiconductor device of the invention.

In the memory transistor shown in this embodiment mode, the electric field is concentrated at edges of a gate electrode 302 that is provided under a semiconductor film 306. By utilizing this phenomenon, charge is selectively injected into regions in a charge accumulation layer 304 between the semiconductor film 306 and the edges of the gate electrode 302 (see FIG. 8A). The electric field concentration at both edges of the gate electrode 302 allows reduction of writing voltage and erasing voltage.

Operation of the memory transistor is described below with reference to the drawings. Note that the values of operating voltages in the following description are just an example, and the invention is not limited to these values.

In general, electrons are injected into the charge accumulation layer 304 by a method utilizing hot electrons or a method utilizing the F—N tunnel current. In the case of utilizing hot electrons, a positive voltage is applied to the gate electrode 302 and a high voltage is applied to a drain, thereby generating hot electrons. As a result, hot electrons can be injected into the charge accumulation layer 304. In the case of utilizing the F—N tunnel current, a positive voltage is applied to the gate electrode 302 and electrons are injected into the charge accumulation layer 304 from a channel forming region of the semiconductor film 306 by the F—N tunnel current.

This embodiment shows a case in which both edges of the gate electrode 302 are utilized and electrons are accumulated in each of the regions between the semiconductor film 306 and the both edges of the gate electrodes 302 in the charge accumulation layer 304.

Figure 9A:
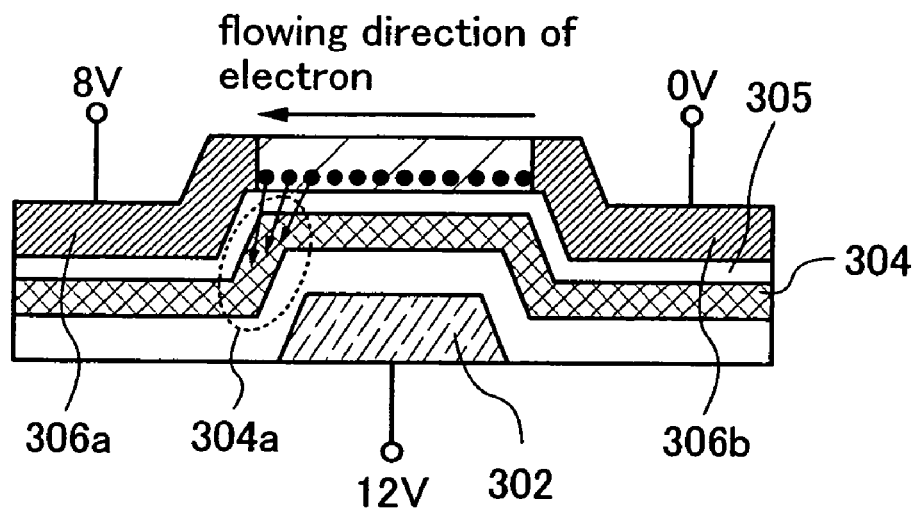
FIGS. 9A and 9B show an example of operation of a semiconductor device of the invention.

FIG. 9A shows applied voltages in the case of injecting electrons into a first region 304*a* of the charge accumulation layer 304 by hot electrons. For example, a positive voltage (8 to 14 V, here 12 V) is applied to the gate electrode 302, and 8 V is applied to a first impurity region 306*a* (source region) of the semiconductor film 306 while 0 V is applied to a second impurity region 306*b* (drain region) of the semiconductor film 306. As a result, the electric field is concentrated at one of the edges of the gate electrode 302, which is located on the side of the first impurity region 306*a*, and electrons flowing through the channel forming region of the semiconductor film 306 are injected into the first region 304*a* of the charge accumulation layer 304 through an insulating film 305 and then trapped. Such electric field concentration at the edge of the gate electrode 302 allows reduction of writing voltage.

While electrons are stored in the first region 304*a* of the charge accumulation layer 304, the threshold voltage of the memory transistor shifts to the positive direction. This state can be referred to as a first state.

The first state can be detected by sensing, with a sensing circuit, that the memory transistor is not turned on even when the memory transistor is supplied with a gate voltage that allows the memory transistor to be turned on in the absence of retained charge in the charge accumulation layer 304.

Figure 9B:
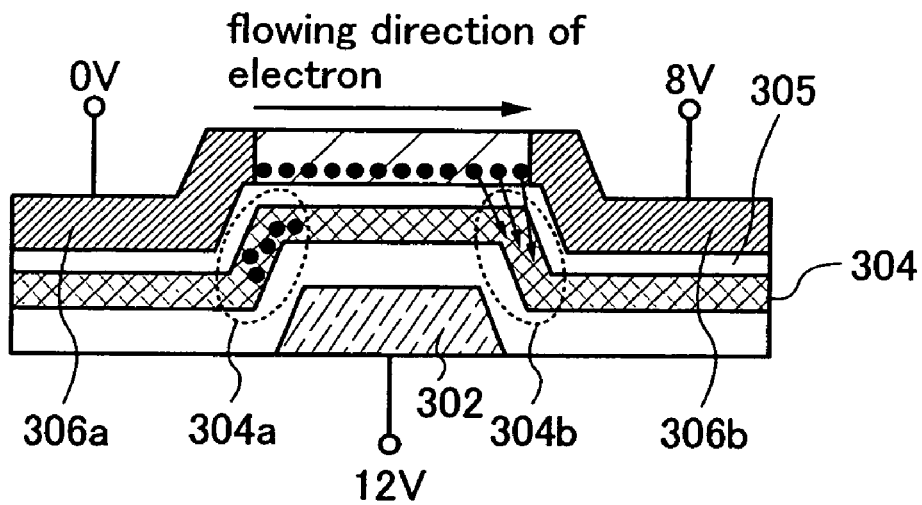

FIG. 9B shows applied voltages in the case of injecting electrons into a second region 304*b* of the charge accumulation layer 304 by hot electrons. For example, a positive voltage (8 to 14 V, and 12 V here) is applied to the gate electrode 302, and 0 V is applied to the first impurity region 306*a* (drain region) while 8 V is applied to the second impurity region 306*b* (source region). As a result, the electric field is concentrated at one of the edges of the gate electrode 302, which is located on the side of the second impurity region 306*b*, and electrons flowing through the channel forming region of the semiconductor film 306 are injected into the second region 304*b* of the charge accumulation layer 304 through the insulating film 305 and then trapped. Such electric field concentration at the edge of the gate electrode 302 allows reduction of writing voltage.

While electrons are stored in the first region 304*a* and the second region 304*b* of the charge accumulation layer 304, the threshold voltage of the memory transistor shifts to the positive direction compared with the state shown in FIG. 9A. This state can be referred to as a second state.

The second state can be detected, with a sensing circuit, by sensing that the memory transistor is not turned on when the memory transistor is supplied with a gate voltage that allows the memory transistor to be turned in the presence of the retained charge in one of the first region 304*a* and the second region 304*b* of the charge accumulation layer 304.

Figure 10A:
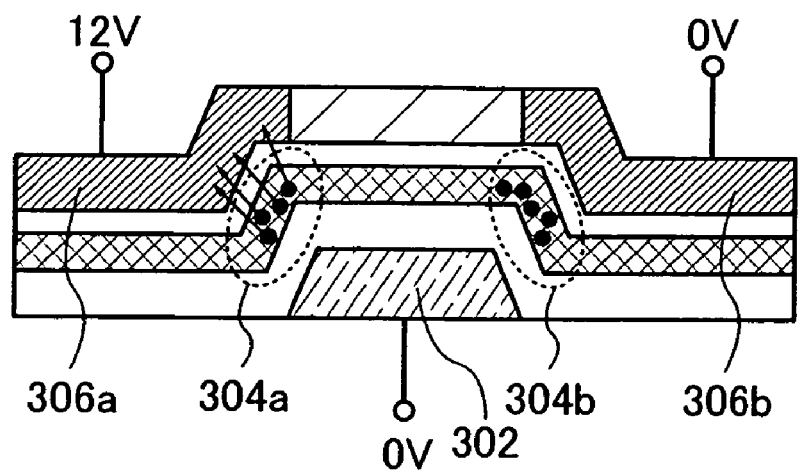
FIGS. 10A and 10B show an example of operation of a semiconductor device of the invention.

FIG. 10A shows a state in which charge is released from the first region 304*a* of the charge accumulation layer 304 to erase data from the memory transistor. In this case, 0 V is applied to the gate electrode 302, and a positive voltage (8 to 14 V) is applied to the first impurity region 306*a* of the semiconductor film 306 while 0 V is applied to the second impurity region 306*b*. As a result, the electric field is concentrated at one of the edges of the gate electrode 302, which is located on the side of the first impurity region 306*a*, and electrons accumulated in the first region 304a of the charge accumulation layer 304 can be extracted to the side of the first impurity region 306a. Such electric field concentration at the edge of the gate electrode 302 allows reduction of erasing voltage. Note that data can be erased not only by extracting electrons from the charge accumulation layer 304 but also by injecting holes into the charge accumulation layer 304 to neutralize charge.

When 0 V is applied to the gate electrode 302 and 0 V is applied to the first impurity region 306a of the semiconductor film 306 while a positive voltage (8 to 14 V) is applied to the second impurity region 306b, charge can be released from the second region 304b of the charge accumulation layer 304.

Figure 10B:
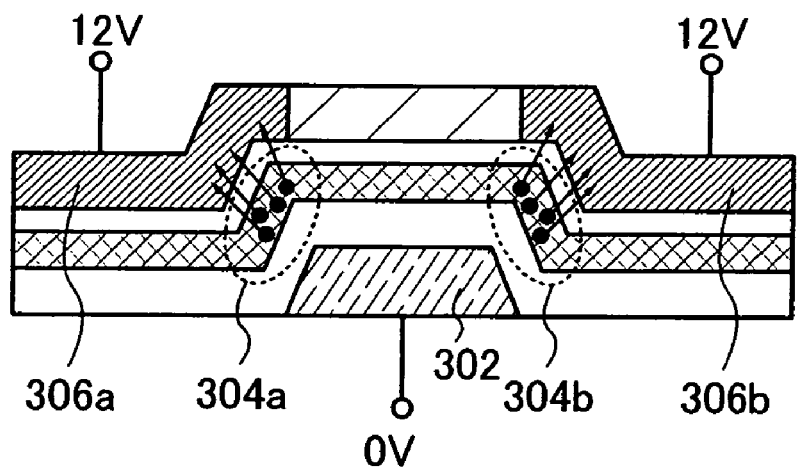

FIG. 10B shows a case in which charge is released from the first region 304a and the second region 304b of the charge accumulation layer 304 at the same time so as to erase data from the memory transistor. In this case, 0 V is applied to the gate electrode 302, and a positive voltage (8 to 14 V) is applied to the first impurity region 306a of the semiconductor film 306 while a positive voltage (8 to 14 V) is applied to the second impurity region 306b. As a result, the electric field is concentrated at the both edges of the gate electrode 302, which are located on the side of the first impurity region 306a and the side of the second impurity region 306b, and electrons accumulated in the first region 304a and the second region 304b of the charge accumulation layer 304 can be extracted to the sides of the first impurity region 306a and the second impurity region 306b. Such electric field concentration at the edges of the gate electrode 302 allows reduction of erasing voltage.

As set forth above, in the MONOS memory transistor having a bottom gate structure, charge is injected or released into/from the charge accumulation layer by utilizing the electric field concentration at the edge of the gate electrode. As a result, low power consumption is achieved.

Figure 8B:
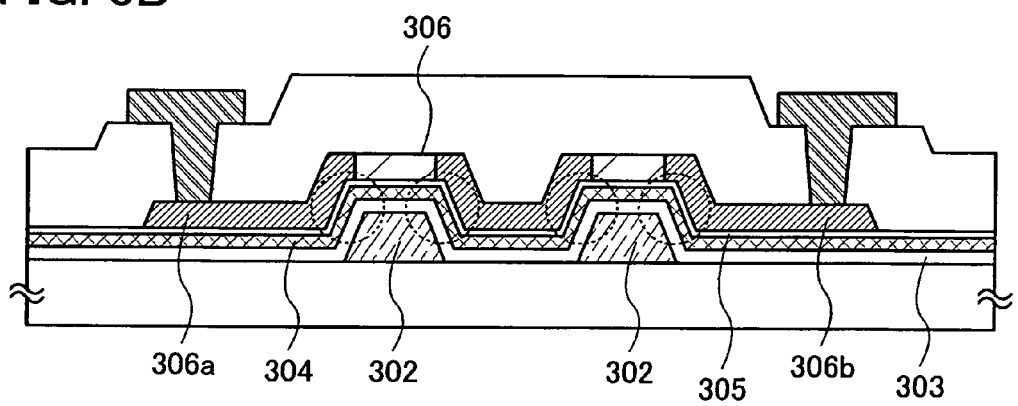

Although this embodiment shows the case of binarization of the memory transistor, the invention is not limited to this case. For example, the memory transistor can be multi-valued by providing a plurality of gate electrodes and utilizing the electric field concentration at the edges of the gate electrodes as shown in FIG. 8B.

This embodiment mode can be combined with any structure of the semiconductor devices described in other embodiment modes of this specification.

Embodiment Mode 5

In this embodiment mode, an application example of a semiconductor device including a memory transistor shown in any of the above embodiment modes, which is capable of transmitting and receiving data in a non-contact manner, is described with reference to the drawings. The semiconductor device capable of transmitting and receiving data in a non-contact manner is also called an RFID tag, an ID tag, an IC tag, an IC chip, an RF tag, a wireless tag, an electronic tag, or a wireless chip depending on the application.

An example of a top surface structure of a semiconductor device shown in this embodiment mode is described with reference to FIG. 11A. A semiconductor device 80 shown in FIGS. 11A and 11B includes a thin film integrated circuit 131 provided with any of the memory transistors and the thin film transistors shown in the above embodiment modes, and a conductive film 132 functioning as an antenna. The conductive film 132 functioning as an antenna is electrically connected to the thin film integrated circuit 131.

Figure 11A:
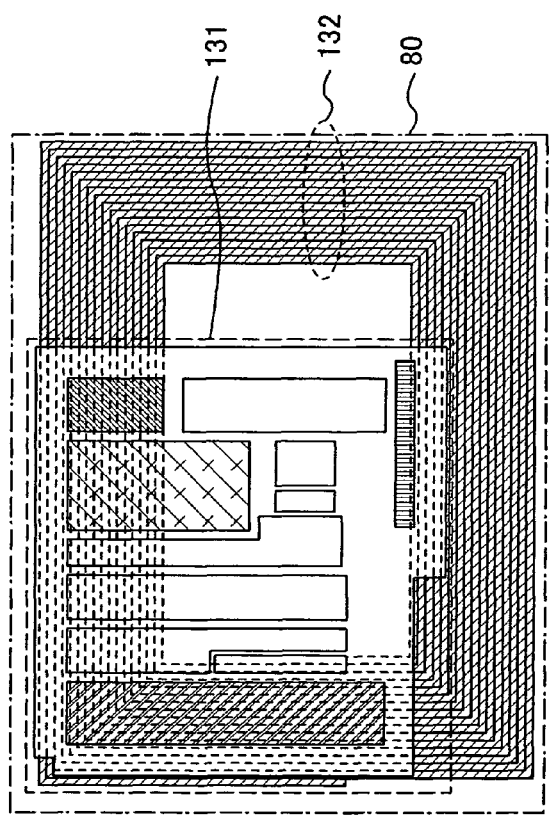
FIGS. 11A and 11B show an example of usage of a semiconductor device of the invention.
Figure 11B:
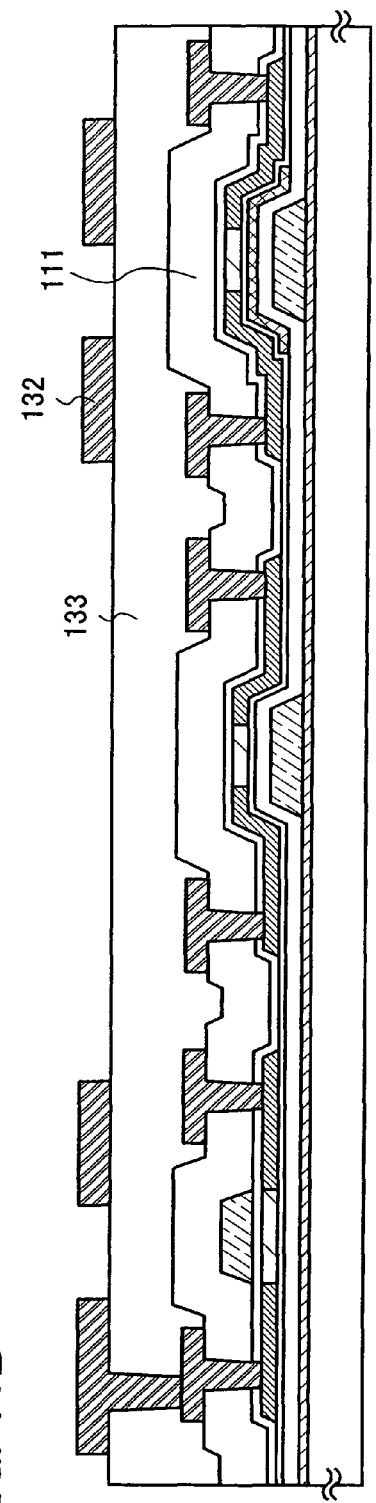

FIG. 11B is a schematic cross-sectional view of FIG. 11A. The conductive film 132 functioning as an antenna may be formed over a memory transistor constituting a memory portion, a thin film transistor constituting a logic portion, and the like. For example, in the structures shown in the above embodiment modes, the conductive film 132 functioning as an antenna can be formed over the insulating film 111 with an insulating film 133 interposed therebetween.

The conductive film 132 functioning as an antenna may be provided so as to overlap the thin film integrated circuit 131, or provided in the periphery of the thin film integrated circuit 131. Further, this embodiment mode shows an example in which the conductive film 132 functioning as an antenna has a coil shape and an electromagnetic induction system or an electromagnetic coupling system is used; however, the invention is not limited to these systems, and a microwave system may also be used. In the case of using the microwave system, the shape of the conductive film 132 functioning as an antenna may be arbitrarily determined depending on the wavelength of an electromagnetic wave.

If an electromagnetic coupling system or an electromagnetic induction system (e.g., 13.56 MHz band) is used as the signal transmission system in the semiconductor device, electromagnetic induction caused by a change in magnetic field density is utilized. Therefore, the conductive film functioning as an antenna is formed into an annular shape (e.g., a loop antenna) or a spiral shape (e.g., a spiral antenna).

If a microwave system (e.g., UHF band (860 to 960 MHz band), 2.45 GHz band, or the like) is used as the signal transmission system in the semiconductor device, the shape such as the length of the conductive film functioning as an antenna may be arbitrarily determined in consideration of the wavelength of an electromagnetic wave used for signal transmission. For example, the conductive film functioning as an antenna may be formed into a linear shape (e.g., a dipole antenna), a flat shape (e.g., a patch antenna), a ribbon shape, or the like. The shape of the conductive film functioning as an antenna is not limited to a linear shape, and it may be a curved line, a meander shape, or a combination thereof in consideration of the wavelength of an electromagnetic wave.

The conductive film 132 functioning as an antenna is formed of a conductive material by CVD, sputtering, a printing method such as screen printing and gravure printing, droplet discharging, a dispenser method, a plating method, or the like. The conductive material is an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy or a compound mainly containing these elements, and a single layer structure or a stacked-layer structure may be adopted.

In the case of providing an antenna, the thin film integrated circuit 131 and the conductive film 132 functioning as an antenna may be directly formed over the same substrate, or they may be formed over different substrates and then attached to each other to be electrically connected.

An example of operation of the semiconductor device shown in this embodiment mode is described.

Figure 12A:
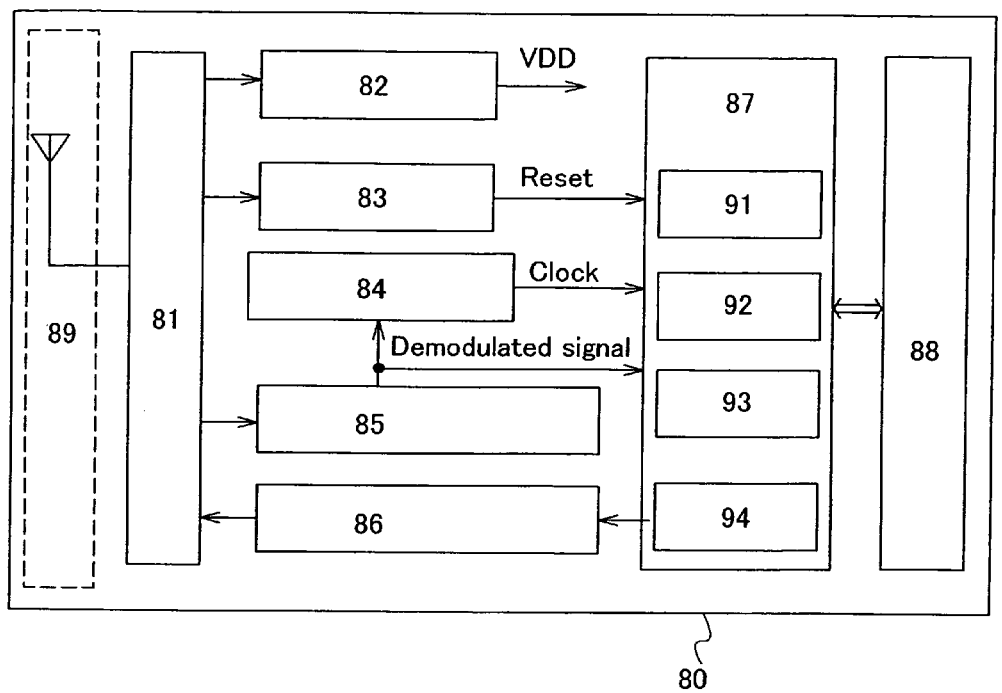
FIGS. 12A to 12C show an example of usage of a semiconductor device of the invention.

The semiconductor device 80 has a function of communicating data in a non-contact manner, and includes a high frequency circuit 81, a power supply circuit 82, a reset circuit 83, a clock generation circuit 84, a data demodulation circuit 85, a data modulation circuit 86, a control circuit 87 for controlling other circuits, a memory circuit 88, and an antenna 89 (FIG. 12A). The memory circuit 88 can be provided with any of the memory transistors shown in the above embodiment modes.

The high frequency circuit 81 receives a signal from the antenna 89 and outputs a signal received from the data demodulation circuit 86 through the antenna 89. The power supply circuit 82 generates a power supply potential from the received signal. The reset circuit 83 generates a reset signal. The clock generation circuit 84 generates various clock signals based on the signal inputted from the antenna 89. The data demodulation circuit 85 demodulates the received signal and outputs the signal to the control circuit 87. The data modulation circuit 86 modulates a signal received from the control circuit 87. The control circuit 87 includes, for example, a code extracting circuit 91, a code determining circuit 92, a CRC determining circuit 93, and an output unit circuit 94. The code extracting circuit 91 extracts a plurality of codes included in an instruction transmitted to the control circuit 87. The code determining circuit 92 compares the extracted code with a code corresponding to a reference to determine the content of the instruction. The CRC determining circuit 93 detects a transmission error and the like based on the determined code.

An example of operation of the above-mentioned semiconductor device 80 is described. First, a radio signal is received by the antenna 89. The radio signal is transmitted to the power supply circuit 82 via the high frequency circuit 81, thereby generating a high power supply potential (hereinafter referred to as a VDD). The VDD is supplied to each circuit of the semiconductor device 80. A signal transmitted to the data demodulation circuit 85 via the high frequency circuit 81 is demodulated (hereinafter referred to as a demodulated signal). Further, a signal and a demodulated signal passing through the reset circuit 83 and the clock generation circuit 84 via the high frequency circuit 81 are transmitted to the control circuit 87. The signals transmitted to the control circuit 87 are decoded by the code extracting circuit 91, the code determining circuit 92, the CRC determining circuit 93, and the like. Then, the data of the semiconductor device 80 stored in the memory circuit 88 is outputted based on the decoded signals. The outputted data of the semiconductor device 80 is encoded via the output unit circuit 94. In addition, the encoded data of the semiconductor device 80 passes through the data modulation circuit 86 to be transmitted via the antenna 89. Note that a low power supply potential (hereinafter referred to as a VSS) is common among a plurality of circuits included in the semiconductor device 80, and the VSS can be set to GND.

In this manner, the data of the semiconductor device 80 can be read by transmitting a signal from a reader/writer to the semiconductor device 80 and receiving a signal from the semiconductor device 80 by the reader/writer.

The semiconductor device 80 may have a structure in which no power supply (battery) is built-in but electromagnetic waves are used to supply a power supply voltage to each circuit, or a structure in which both electromagnetic waves and a power supply (battery) are used to generate a power supply voltage for each circuit.

Figure 12B:
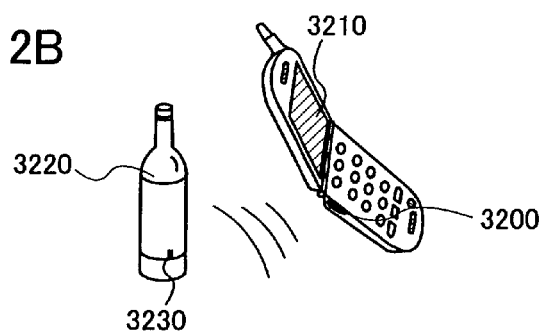
Figure 12C:
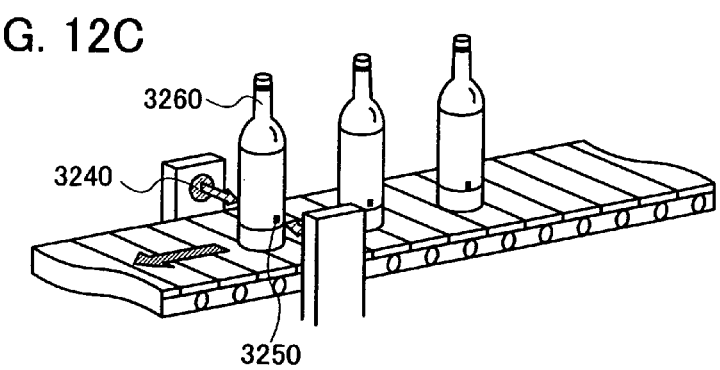

Description is made on an example of a usage of a semiconductor device capable of transmitting and receiving data in a non-contact manner. A reader/writer 3200 is provided on the side of a portable terminal including a display portion 3210, and a semiconductor device 3230 is provided on the side of a product 3220 (FIG. 12B). When the reader/writer 3200 is put close to the semiconductor device 3230 on the product 3220, data on the raw material or the source of the product, inspection result in each production step, history of the distribution process, product description, and the like is displayed on the display portion 3210. When a product 3260 is transferred by a conveyer belt, the product 3260 can be inspected using a reader/writer 3240 and a semiconductor device 3250 provided on the product 3260 (FIG. 12C). The use of the semiconductor device for such a system allows the data to be easily obtained, thereby achieving a system with high function and high added-value.

The semiconductor device including any of the memory transistors shown in the above embodiment modes can be applied to electronic apparatuses of various fields, which are equipped with a memory. For example, electronic apparatuses using any of the memory transistors shown in the above embodiment modes includes a camera such as a video camera and a digital camera, a goggle type display (a head mounted display), a navigation system, an audio reproducing device (car audio set, audio component set, or the like), a computer, a game machine, a portable information terminal (mobile computer, mobile phone, portable game machine, electronic book, or the like), an image reproducing device provided with a recording medium (specifically, a device that reproduces a recording medium such as a DVD (digital versatile disc) and has a display for displaying the reproduced image), and the like. Specific examples of these electronic apparatuses are shown in FIGS. 13A to 13E.

Figure 13A:
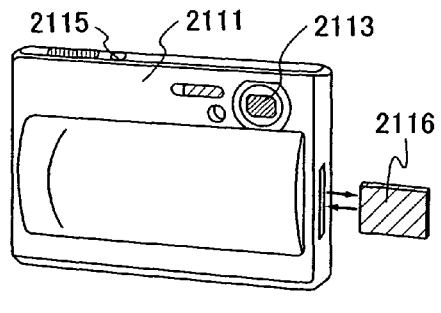
FIGS. 13A to 13E show an example of usage of a semiconductor device of the invention.
Figure 13B:
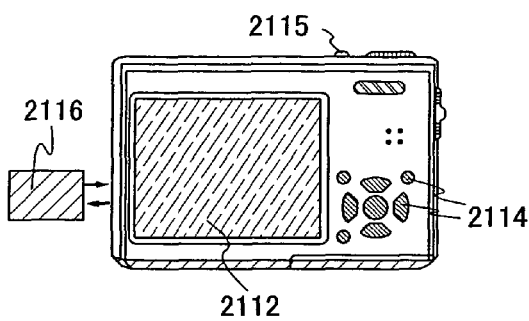

FIGS. 13A and 13B show a digital camera. FIG. 13B shows the back of the digital camera of FIG. 13A. This digital camera includes a housing 2111, a display portion 2112, a lens 2113, operation keys 2114, a shutter button 2115, and the like. Further, the digital camera includes a removable nonvolatile memory 2116 for storing data photographed by the digital camera. Any of the memory transistors shown in the above embodiment modes can be applied to the memory 2116.

Figure 13C:
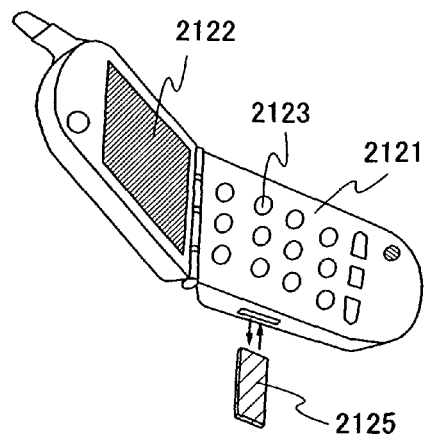

FIG. 13C shows a mobile phone that is a typical example of the portable terminals. The mobile phone includes a housing 2121, a display portion 2122, operation keys 2123, and the like. Further, the mobile phone includes a removable nonvolatile memory 2125 for storing and reproducing data such as telephone numbers, image data, and sound data. Any of the memory transistors shown in the above embodiment modes can be applied to the memory 2125.

Figure 13D:
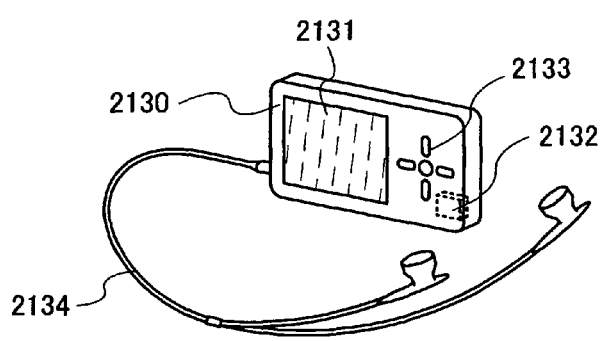

FIG. 13D shows a digital player that is a typical example of the audio devices. The digital player shown in FIG. 13D includes a main body 2130, a display portion 2131, a memory portion 2132, an operation portion 2133, an earphone 2134, and the like. Note that headphones or wireless earphones can be used instead of the earphone 2134. Any of the memory transistors shown in the above embodiment modes can be applied to the memory portion 2132. For example, a NAND nonvolatile memory with a capacity of 20 to 200 gigabytes (GB) may be used to operate the operation portion 2133, thereby storing and reproducing image and sound (music) data. Note that the power consumption of the display portion 2131 can be suppressed by displaying white characters on the black background. This is particularly effective in portable audio devices.

Figure 13E:
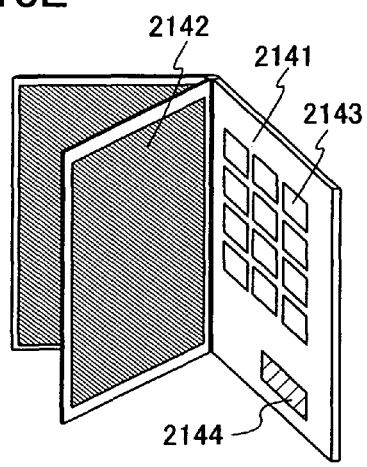

FIG. 13E shows an electronic book (also referred to as electronic paper). The electronic book includes a main body 2141, a display portion 2142, operation keys 2143, and a memory portion 2144. In addition, a modem may be built-in the main body 2141, or a structure in which data can be wirelessly transmitted and received may be employed. Any of the memory transistors shown in the above embodiment modes can be applied to the memory portion 2144. For example, a NAND nonvolatile memory with a capacity of 20 to 200 gigabytes (GB) may be used to operate the operation keys 2143, thereby storing and reproducing image and sound (music) data.

As set forth above, the application range of the memory transistors shown in the above embodiment modes is so wide that the memory transistors can be applied to electronic apparatuses of all fields if a memory is included.

This embodiment mode can be implemented by freely combining with other embodiment modes of this specification.

This application is based on Japanese Patent Application serial no. 2007-173103 filed in Japan Patent Office on Jun. 29, 2007, the entire contents of which are hereby incorporated by reference.

EXPLANATION OF REFERENCE

101: substrate, 102: first electrode, 103: first layer, 104: second layer, 105: third layer, 106: fourth layer, 107: second electrode, 301: substrate, 302: first electrode, 303: first layer, 304: second layer, 305: third layer, 306: fourth layer, 307: second electrode, 501: first electrode, 502: second electrode, 511: first light-emitting unit, 512: second light-emitting unit, 513: charge generation layer, 601: source side driver circuit, 602: pixel portion, 603: gate side driver circuit, 604: sealing substrate, 605: sealing material, 607: space, 608: wiring, 609: FPC (flexible printed circuit), 610: element substrate, 611: switching TFT, 612: current control TFT, 613: first electrode, 614: insulator, 616: layer including light-emitting substance, 617: second electrode, 618: light-emitting element, 623: n-channel TFT, 624: p-channel TFT, 901: housing, 902: liquid crystal layer, 903: backlight, 904: housing, 905: driver IC, 906: terminal, 951: substrate, 952: electrode, 953: insulating layer, 954: partition layer, 955: layer including light-emitting substance, 956: electrode, 2001: housing, 2002: light source, 2101: glass substrate, 2102: first electrode, 2103: layer including composite material, 2104: hole transporting layer, 2105: light-emitting layer, 2106: electron transporting layer, 2107: electron injecting layer, 2108: second electrode, 3001: lighting device, 3002: television device, 9101: housing, 9102: supporting base, 9103: display portion, 9104: speaker portion, 9105: video input terminal, 9201: main body, 9202: housing, 9203: display portion, 9204: keyboard, 9205: external connection port, 9206: pointing device, 9401: main body, 9402: housing, 9403: display portion, 9404: audio input portion, 9405: audio output portion, 9406: operation key, 9407: external connection port, 9408: antenna, 9501: main body, 9502: display portion, 9503: housing, 9504: external connection port, 9505: a remote control receiving portion, 9506: image receiving portion, 9507: battery, 9508: audio input portion, 9509: operation key, 9510: eye piece portion

The invention claimed is:

1. A method for manufacturing a semiconductor device, comprising the steps of:
    forming a first conductive film and a second conductive film over a substrate;
    forming a first insulating film over the first conductive film and the second conductive film;
    removing a part of the first insulating film, allowing the first insulating film to be left over the second conductive film and the first conductive film to be exposed;
    forming a second insulating film over the first conductive film and the first insulating film;
    forming a charge accumulation layer over the first conductive film with the second insulating film interposed therebetween, allowing the charge accumulation layer not to overlap the second conductive film;
    forming a tunnel insulating film over the charge accumulation layer, allowing the tunnel insulating film not to overlap the second conductive film;
    forming over the tunnel insulating film a first semiconductor film that overlaps the first conductive film;
    forming over the second insulating film a second semiconductor film that overlaps the second conductive film, and a third semiconductor film that does not overlap either the first conductive film or the second conductive film;
    forming a third insulating film over the first semiconductor film, the second semiconductor film, and the third semiconductor film; and
    forming a third conductive film over the third semiconductor film with the third insulating film interposed therebetween.

2. The method for manufacturing the semiconductor device according to claim 1, the method further comprising the steps of:
    forming over the third insulating film a fourth conductive film that overlaps the first semiconductor film; and
    forming over the third insulating film a fifth conductive film that overlaps the second semiconductor film.

3. The method for manufacturing the semiconductor device according to claim 1,
    wherein each of the second insulating film, the third insulating film, and the tunnel insulating film has a thickness smaller than that of the first insulating film.

4. The method for manufacturing the semiconductor device according to claim 1, the method further comprising the steps of:
    forming a resist over the first semiconductor film and the second semiconductor film after forming the third conductive film; and
    introducing an impurity element into the first semiconductor film, the second semiconductor film, and the third semiconductor film.

5. The method for manufacturing the semiconductor device according to claim 1,
    wherein the charge accumulation layer is formed of an insulating material containing nitrogen.

6. The method for manufacturing the semiconductor device according to claim 1,
    wherein the charge accumulation layer is formed of an insulating material containing nitrogen, and
    wherein the charge accumulation layer contains a conductive particle or a semiconductor particle.

7. The method for manufacturing the semiconductor device according to claim 1,
    wherein the charge accumulation layer is formed of a conductive material.

8. The method for manufacturing the semiconductor device according to claim 1,
    wherein the tunnel insulating film is formed by oxidizing the charge accumulation layer by plasma treatment.

* * * * *